United States Patent [19]
Iizuka

[11] Patent Number: 5,912,584
[45] Date of Patent: Jun. 15, 1999

[54] ANALOG SIGNAL PROCESSING DEVICE AND CORRELATION COMPUTING DEVICE

[75] Inventor: Kunihiko Iizuka, Sakai, Japan

[73] Assignee: Sharp Kabushiki Kaisha, Osaka, Japan

[21] Appl. No.: 08/870,821

[22] Filed: Jun. 6, 1997

[30] Foreign Application Priority Data

Jun. 7, 1996 [JP] Japan .................................. 8-146219
Jun. 5, 1997 [JP] Japan .................................. 9-148231

[51] Int. Cl.$^6$ ...................................................... H03F 1/34
[52] U.S. Cl. .............................................. 330/85; 330/290
[58] Field of Search ............................ 330/69, 85, 290; 327/356, 358

[56] References Cited

U.S. PATENT DOCUMENTS

| | | | |
|---|---|---|---|
| 4,543,536 | 9/1985 | Pederson | 330/85 |
| 4,760,346 | 7/1988 | Kultgen et al. | 330/69 |
| 5,381,352 | 1/1995 | Shou et al. | 364/606 |
| 5,717,361 | 2/1998 | Saito | 330/290 |

FOREIGN PATENT DOCUMENTS 6-215164  8/1994  Japan .

*Primary Examiner*—Steven J. Mottola

[57] ABSTRACT

In an analog signal processing device, an output signal and a reference level are compared by a comparator, and a result of comparison is filtered by a low-pass filter. By doing so, an adaptive control signal is generated so as to correspond to a background signal component having a low frequency, included in an input signal, and is negatively fed back to a signal processing unit. With this arrangement, the background signal component is compensated by the adaptive control signal having a frequency band sufficiently separate from a frequency band of a target signal component to be processed, the component being included in the input signal. As a result, a DC level of the output signal is stabilized at the reference level. Therefore, the signal processing device of a capacitive coupling type incorporating an amplifier, an input capacitor, and a feedback capacitor is allowed to carry out an adaptive control operation for keeping a DC level of the output signal to a desired level, with respect to changes in the background signal component or a shift of the input signal from an input reference level (average value), without suspending a signal processing operation. As a result, a spare circuit for a refreshing operation for compensating an off-set voltage of the amplifier can be omitted.

23 Claims, 18 Drawing Sheets

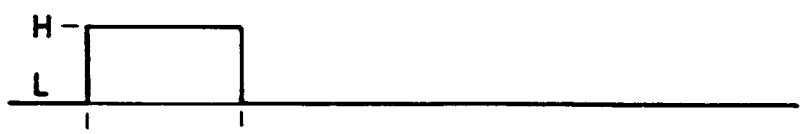
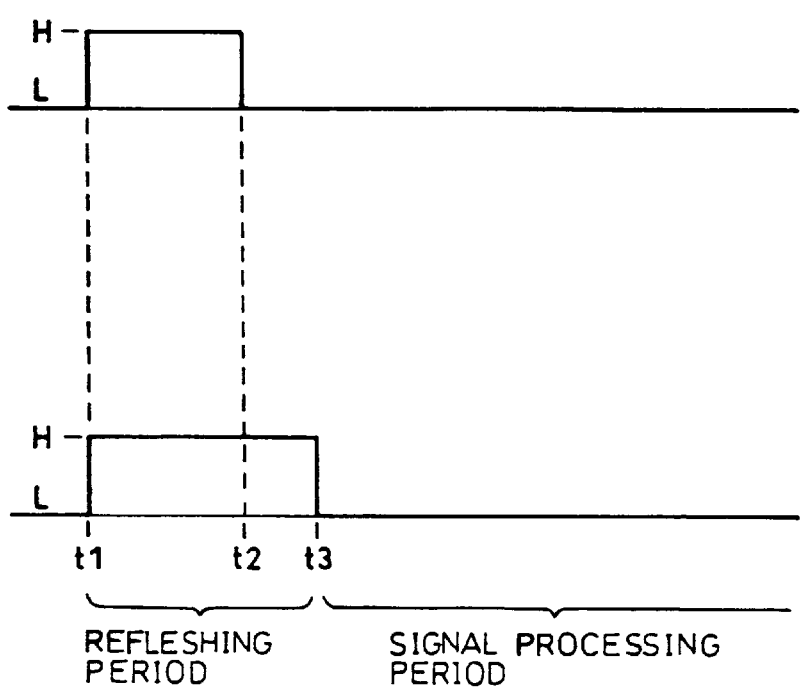

ANALOG SIGNAL PROCESSING DEVICE AND CORRELATION COMPUTING DEVICE

FIELD OF THE INVENTION

The present invention relates to an analog signal processing device incorporating amplifiers such as differential amplifiers realized with CMOSs, which is for carrying out a signal processing operation, for example, an amplifying operation with respect to input analog signals. The present invention also relates to a correlation computing device such as a matched filter incorporating the analog signal processing device.

DESCRIPTION OF THE BACKGROUND ART

As illustrated in FIG. 15, an analog signal processing circuit 1, as a concrete example of a conventional analog signal processing device, incorporates an amplifier AMP1 realized with a CMOS inverter or the like, an input capacitor Ci, and a feedback capacitor Cf. Varieties of practical application of the analog signal processing circuit 1, as a basic circuit for processing signals in the analog form have been studied. For example, the Japanese Publication for Laid-open Patent Application No. 6-215164/1994 (Tokukaihei No. 6-215164) discloses an example of application thereof in a multiplying circuit. Moreover, application thereof in a sample and hold circuit, a scaling circuit, an add-subtract circuit, a filtering circuit, or the like for analog voltages has been studied, too.

The analog signal processing circuit 1 processes an input signal Vin in the analog form without converting it, and outputs an output signal Vout including voltage changes corresponding to the processing.

On the other hand, in order to digitally process signals, analog/digital conversion and digital/analog conversion are required, which causes expansion of a circuit in size and an increase in power consumption. Besides, with an increase in quantized bits in order to achieve higher precision, processing drastically increases for an arithmetic operation, which also leads to expansion of the circuit in size and an increase in power consumption. In contrast, in the case where the signals are processed in the analog form without conversion as described above, such a problem by no means occurs. Therefore, it is expected that by using the analog signal processing circuit for the above-described purposes, reduction of the circuit size and a decrease in the power consumption can be achieved.

Regarding the analog signal processing circuit 1 as shown in FIG. 15, which is a capacitive coupling type, a requisite condition for the signal processing operation is that a node n1 serving as an input end of the amplifier AMP1 has a high impedance and a quantity of the electric charge of the node n1 does not change over a period while the input signals are supplied. For this reason, a MOS field effect transistor (MOSFET) is used in an input stage of the amplifier AMP1, while the node n1 is arranged so as to be in an electrically floating state.

Static input/output characteristics of the analog signal processing circuit 1 are expressed as:

$$Vo-Vr=-G(Vi-Vr) \quad (1)$$

where $-G$ ($G>0$) represents a gain of the amplifier AMP1, Vi represents an input voltage supplied to the amplifier AMP1, Vo represents an output voltage from the amplifier AMP1, and Vr represents an operating point voltage of the amplifier AMP1, that is, an input voltage Vi when the following is satisfied:

$$Vo=Vi \quad (2)$$

In an analog signal processing circuit 1 incorporating the amplifier AMP1 thus arranged, let Q be a quantity of charges (hereinafter referred to as charge quantity) accumulated in the node n1 in the floating state, and the gain G be considerably great, then the static input/output characteristics of the analog signal processing circuit 1 are expressed as:

$$Vout-Vr=-(Ci/Cf)(Vin-Vr)-Q/Cf \quad (3)$$

Here, $-Q/Cf$ represents an off-set.

Incidentally, it is extremely difficult to regulate the charge quantity Q to 0 during a manufacturing stage, and the charge quantity Q varies, thereby causing the variation of DC levels of the output signals Vout. Besides, the charge quantity Q may sometimes vary due to intrusion of hot electrons while the analog signal processing circuit 1 is run for a signal processing operation. Furthermore, even in the case where the charge quantity Q is regulated to zero, the operating point voltage Vr of the amplifier AMP1 varies, thereby causing the above-mentioned DC levels to vary. Particularly in the case where the amplifier AMP1 is a differential amplifier, if the input off-set varies, DC off-set of the output signal Vout occurs.

Therefore, practical application of the analog signal processing circuit 1 shown in FIG. 15 to industrial fields is difficult the analog signal processing circuit 1 is not modified. Accordingly, a conventional analog signal processing circuit 2 (see FIG. 16) has been proposed. In the analog signal processing circuit 2, the members having the same structure (function) as those in the aforementioned analog signal processing circuit 1 will be designated by the same reference numerals and their description will be omitted. The analog signal processing circuit 2, having the same arrangement as that of the analog signal processing circuit 1, further includes a set of switches S1 through S3 for a refreshing operation for compensating an off-set voltage.

The switch S1, provided between the input and output ends of the amplifier AMP1, is closed when a control signal $\phi1$ is at a high level, thereby directly connecting the input end with the output end. The switch S2, provided on an input side of an input capacitor Ci, supplies an input signal Vi to the input capacitor Ci when a control signal $\phi2$ is at a low level and supplies a voltage at a reference level (hereinafter referred to as reference voltage) Vref when the control signal $\phi2$ is at the high level. The switch S3, provided so as to switch voltages to be supplied to a feedback capacitor Cf, supplies thereto the output voltage Vo of an amplifier AMP1 when the control signal $\phi2$ is at the low level and supplies the reference voltage Vref when it is at the high level.

FIGS. 17(a) and 17(b) are timing charts explaining operations of the analog signal processing circuit 2. A set of a refreshing period and a signal processing period provided in a period of a predetermined duration is repeated. At a time t1 when the refreshing period starts, the control signals $\phi1$ and $\phi2$ shift to the high level as illustrated in FIGS. 17(a) and 17(b), respectively. With this, the switch S1 is closed, thereby directly connecting the input end and the output end of the amplifier AMP1 to each other, while at the same time the reference voltage Vref is respectively applied to the capacitors Ci and Cf.

As a result, charges corresponding to the input offset voltage of the amplifier AMP1 are accumulated at the node n1. Subsequently, the control signal $\phi1$ shifts to the low level at a time t2 thereby causing the switch S1 to go off. The control signal $\phi2$ at a time t3 shifts to the low level, whereby the input signal Vin is supplied to the input capacitor Ci through the switch S2, while the output voltage Vo of the amplifier AMP1 is supplied to the feedback capacitor Cf through the switch S3. As a result, a signal processing operation can be carried out at any time after the time t3.

Thus the refreshing operation ends, whereby the charge quantity Q becomes zero. Here, the static input/output characteristics of the analog signal processing circuit 2 are expressed as:

$$Vout - Vref = -(Ci/Cf)(Vin - Vref) \quad (4)$$

However, there exist the following problems. In the case where a background voltage composed of DC components of the input signal Vin and components having frequencies considerably lower than those of signal components to be processed coincides with the reference voltage Vref, the signal processing operation is applied only to the signal components to be processed. But, usually the background voltage is not constant. This is a hindrance to the practical application of the analog signal processing circuit 2.

Besides, since the switch S1 is composed of, for example, a MOSFET, even in a state where the switch S1 should completely go off, a slight leak current flows through the switch S1, thereby making it impossible to keep an amount of charges at the node n1 to a constant level over a long period. Therefore, it is necessary to frequently repeat the refreshing operation as is done between the times t1 and t3, whereas the signal processing operation is suspended during the refreshing periods. For this reason, the analog signal processing circuits 2 are actually applied to a circuit arranged, for example, as shown in FIG. 18.

FIG. 18 is a block diagram illustrating an electric arrangement of a matched filter 11 for the use in a demodulator circuit of a code division multiple access (CDMA) system, which is used in a digital automotive/pocket telephone. According to the CDMA system, signals are diffused by psuedo noise (PN) codes, which are respectively allocated to agencies, for example. On a receiving side, received signals are sequentially sampled at predetermined sampling intervals by a plurality of sample and hold circuits SH1, SH2, . . ., SHm (collectively referred to as sample and hold circuits SH) which are connected in cascade. Then, voltages thus held by the sample and hold circuits SH are multiplied by coefficients corresponding to the PN code, and thereafter the multiplied results are added and subtracted. Herein, when the PN code for the received signals conforms with the PN code of the matched filter 11, thereby causing an output as the result of the adding and subtracting to have a peak value, the signals are inversely diffused.

The matched filter 11 is provided with two add-subtract circuits 12 and 13 for summing products, and multiplexors 14 and 15 for switching the add-subtract circuits 12 and 13. The voltages held by the sample and hold circuits SH are selectively sent to either the add-subtract circuit 12 or the add-subtract circuit 13 by the multiplexor 14. The PN code is given to the multiplexor 14, which supplies a bit of +1 of the PN code to an adder of either the add-subtract circuit 12 or 13, and supplies a bit of −1 of the PN code to a subtractor of either the add-subtract circuit 12 or 13. The multiplexor 15 outputs an output voltage from either the add-subtract circuit 12 or 13, to which the output voltages from the sample and hold circuits SH and the PN code have been supplied from the multiplexor 14. Thus, the matched filter 11 is arranged so that while either the add-subtract circuit 12 or 13 is carrying out a product-summing computation, the other add-subtract circuit carries out the refreshing operation of the analog signal processing circuit 2.

FIG. 19 is a block diagram illustrating a concrete example of an arrangement of the add-subtract circuits 12 and 13.

Each of the add-subtract circuits 12 and 13 has two product adders 16 and 17 to which outputs of the sample and hold circuits SH are parallely supplied, an inverter 18, and an adder 19. The product adder 16 is composed of input capacitors $Ci^+1, Ci^+2, \ldots, Ci^+m$ (collectively referred to as input capacitors $Ci^+$) having respective positive coefficients corresponding to the PN code. The product adder 16 multiplies the outputs of the sample and hold circuits SHi respectively corresponding to the positive PN code by respective capacitance ratios $Ci^+/Cf^+$ relating to the input capacitors $Ci^+$ and the feedback capacitor $Cf^+$ as coefficients, and adds the multiplied results to each other, thereby outputting the added result.

On the other hand, the product adder 17 is composed of input capacitors $Ci^-1, Ci^-2, \ldots, Ci^-m$ (collectively referred to as input capacitors $Ci^-$) having respective negative coefficients corresponding to the PN code. The product adder 17 multiplies the outputs parallely supplied from the sample and hold circuits SHi respectively corresponding to the negative PN code by respective negative coefficients $Ci^-/Cf^-$, and adds the multiplied results to each other, thereby outputting the added result. Note that as to each pair of the input capacitors having the same reference numeral but + and − respectively, for example, $Ci^+1$ and $Ci^-1$, an output of the sample and hold circuit SHi is supplied to either of them while the reference voltage is supplied to the other.

The output of the product adder 17 is inverted by the inverter 18, and thereafter the inverted result is added to the output of the product adder 16 by the adder 19. The added result is supplied to the multiplexor 15. The analog signal processing circuits 2 are provided in these add-subtract circuits 12 and 13 as the product adders 16 and 17, the inverter 18, and the adder 19. Therefore, in the matched filter 11, the add-subtract circuits 12 and 13 are switched by the multiplexor 14 and 15 as described above, so that the refreshing operation is alternately applied to the analog signal processing circuits 2.

As described above, the analog signal processing circuit 2 requires the refreshing operation in order to control the amount of charges at the node n1. Therefore, in the case where the refreshing operation and the signal processing operation are carried out by time sharing, a spare circuit is needed in order not to suspend the signal processing. Besides, a system for switching control such as a clock oscillating circuit is required. Therefore, the following problems arise: the circuit expands in size and power consumption increases, while noises are generated due to the switching operation.

SUMMARY OF THE INVENTION

The object of the present invention is to provide an analog signal processing device which is capable of adjusting a DC level of an output signal to a desired set level by compensating error factors such as the charge quantity Q while processing signals, and to provide a correlation computing device incorporating the analog signal processing device.

To achieve the above object, an analog signal processing device of the present invention is an analog signal processing device of a capacitive coupling type, incorporates (1) an amplifier, (2) an input capacitor provided at an input end of the amplifier, (3) a feedback capacitor provided between the input end an output end of the amplifier, and (4) an adaptive control circuit for adjusting a DC level of an output signal of the amplifier to an operating point voltage of the amplifier, by negatively feeding back, to an input end of the amplifier, only a low frequency component of a difference between the output signal and the operating point voltage, the low frequency component sharing no frequency band with a target signal to be processed, the target signal being included in an input signal supplied to the amplifier.

According to the above-described arrangement, the adaptive control circuit feeds back a signal for the adaptive control which has a low frequency band sufficiently separate from a frequency band of a target signal component included in the input signal.

Therefore, a DC level of the output signal is kept at a level of the operating point voltage, thereby ensuring accurate signal processing operations. This arrangement is effective in the following cases: (1) in the case where the quantity of charges at the input end of the amplifier as a floating node varies during a manufacturing stage or in the case where the quantity of the charges at the input end changes due to intrusion of hot electrons during the signal processing operation, such variation or changes of the quantity of the charges may cause changes in the background voltage of the input signal, which is composed of DC and low frequency components; and (2) an average level of the input signals shifts from an input reference level of the analog signal processing device. Furthermore, in the case where a plurality of the analog signal processing devices are provided in parallel for a plurality of channels, differences among the input reference levels of the channels can be compensated.

Thus, it is possible to, with the processing operation of the input signals not suspended but continued, compensate a change of the background voltage included in the input signal and a shift of the reference level of the input signal from the reference level of the analog signal processing device, with the use of an adaptive control signal which has a frequency band sufficiently separate from the frequency band of the target signal components to be processed, and hence does not affect the target signal components. This arrangement does not require a spare circuit for compensation, thereby ensuring reduction of the circuit in size and a decrease in the power consumption. Besides, an inconvenience such as noises generated because of switching between the original circuit and the spare circuit by no means occurs.

To achieve the aforementioned object of the present invention, another analog signal processing circuit of the present invention is an analog signal processing device of a capacitive coupling type, incorporating (1) an amplifier, (2) an input capacitor, provided at an input end of said amplifier, (3) a feedback capacitor, provided between the input end an output end of said amplifier, and (4) an adaptive control circuit for adjusting a DC level of an output signal of said amplifier to a predetermined reference level, by negatively feeding back, to an input end of said amplifier, only a low frequency component of a difference between the output signal and the predetermined reference level, the low frequency component sharing no frequency band with a target signal to be processed, the target signal being included in an input signal supplied to said amplifier.

According to the foregoing arrangement, the adaptive control circuit feeds back a signal for the adaptive control which has a low frequency band sufficiently separate from a frequency band of a target signal component included in the input signal.

Therefore, it is possible to, with the processing operation of the input signals not suspended but continued, compensate a change in the background voltage included in the input signal and a shift of a reference level of the input signal from the reference level of the analog signal processing device, with the use of an adaptive control signal which has a frequency band sufficiently separate from the frequency band of the target signal components to be processed, and hence does not affect the target signal components. This arrangement does not require a spare circuit for compensation, thereby ensuring reduction of the circuit in size and a decrease in the power consumption. Besides, an inconvenience such as noises generated because of switching between the original circuit and the spare circuit by no means occurs.

Besides, unlike the operating point voltage which has a fixed value due to an input off-set voltage, the input off-set voltage in the above case is compensated by the feedback control by the adaptive control circuit with respect to the low frequency component, whereby the DC level of the output signal is adjusted to a desired reference level. As a result, even in the case where a plurality of the analog signal processing devices are provided in parallel for a plurality of channels, the respective DC levels of the output signals of the analog signal processing circuits are made to coincide with each other, thereby ensuring that signal processing operations afterwards, including an operation for checking whether or not the output signals coincide with each other, are carried out with high precision.

For a fuller understanding of the nature and advantages of the invention, reference should be made to the ensuing detailed description taken in conjunction with the accompanying drawings.

BRIEF DESCRIPTION OF THE DRAWINGS

FIG. 10 (*b*) is a waveform chart of an output signal for explaining an adaptive control operation of the analog signal processing circuit shown in FIG. 7.

FIGS. 17(a) and 17(b) are timing charts for explaining operations of the analog signal processing circuit shown in FIG. 16.

DESCRIPTION OF THE PREFERRED EMBODIMENTS

The following description will explain a first embodiment of the present invention, while referring to FIGS. 1 through 6.

Figure 1:
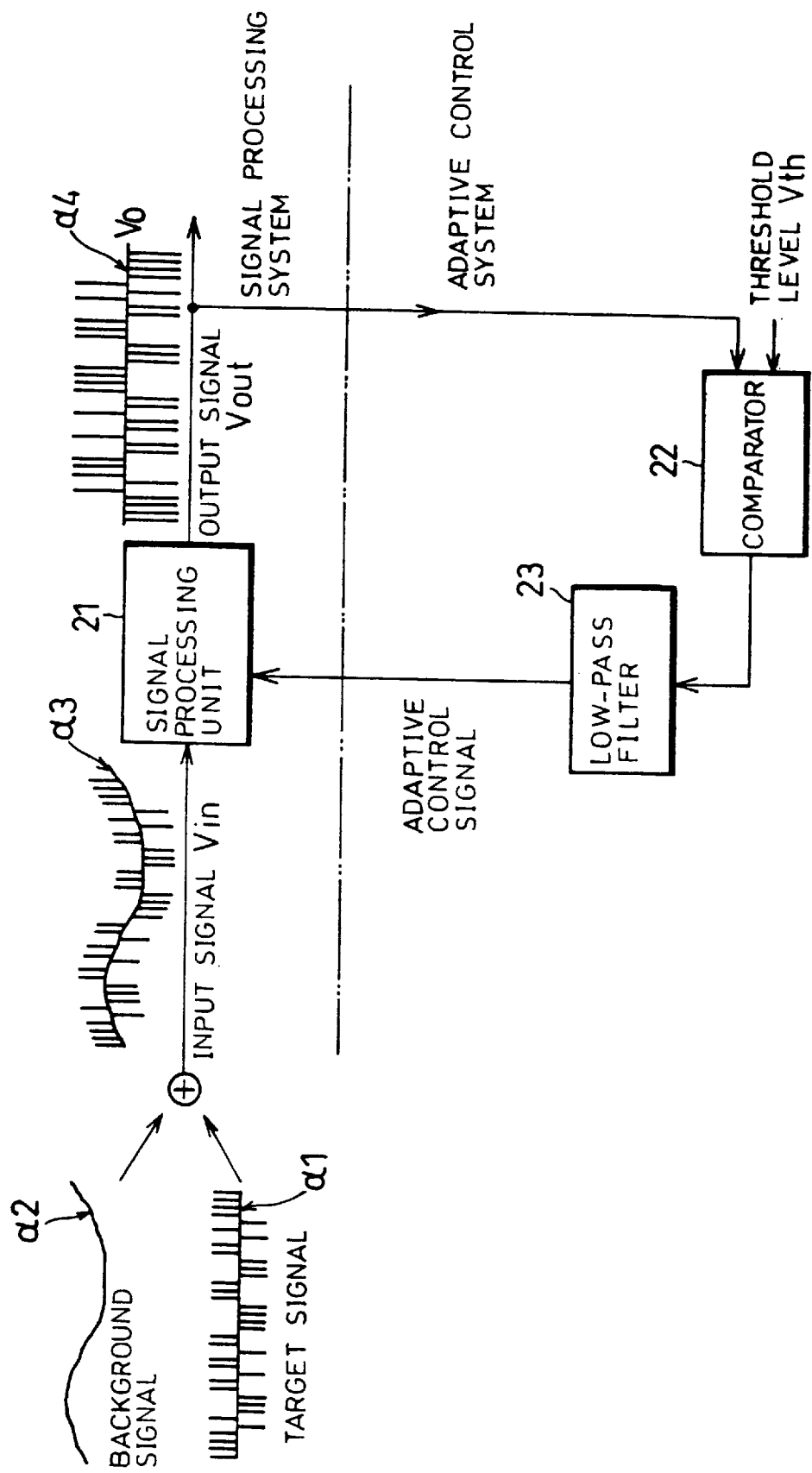
FIG. 1 is a block diagram for explaining a principle of the present invention.

FIG. 1 is a block diagram for explaining a principle of the present invention. In a signal processing system, a target signal, indicated by a reference code α1, is superimposed on a background signal, indicated by a reference code α2, having a frequency sufficiently lower than that of the target signal. As a result, a signal indicated by a reference code α3 is obtained, and it is supplied to a signal processing unit 21 as an input signal Vin. The signal processing unit 21 processes (inverts and amplifies in this case shown in FIG. 1) the input signal Vin, and outputs, as an output signal Vout, a signal indicated by a reference code α4 thus obtained.

The output signal Vout, supplied to an adaptive control system arranged in accordance with the present invention, is sent to a comparator 22. The comparator 22 compares the output signal Vout with a voltage Vth set to a predetermined threshold level (hereinafter referred to threshold voltage Vth), so as to derive an output which is to be used for adapting characteristics of the signal processing unit 21 to the input signal Vin. Low frequency components of the output of the comparator 22 which correspond to a frequency component of the background signal are filtered by a low-pass filter 23, thereby becoming an adaptive control signal, which is fed back to the signal processing unit 21.

Figure 2:
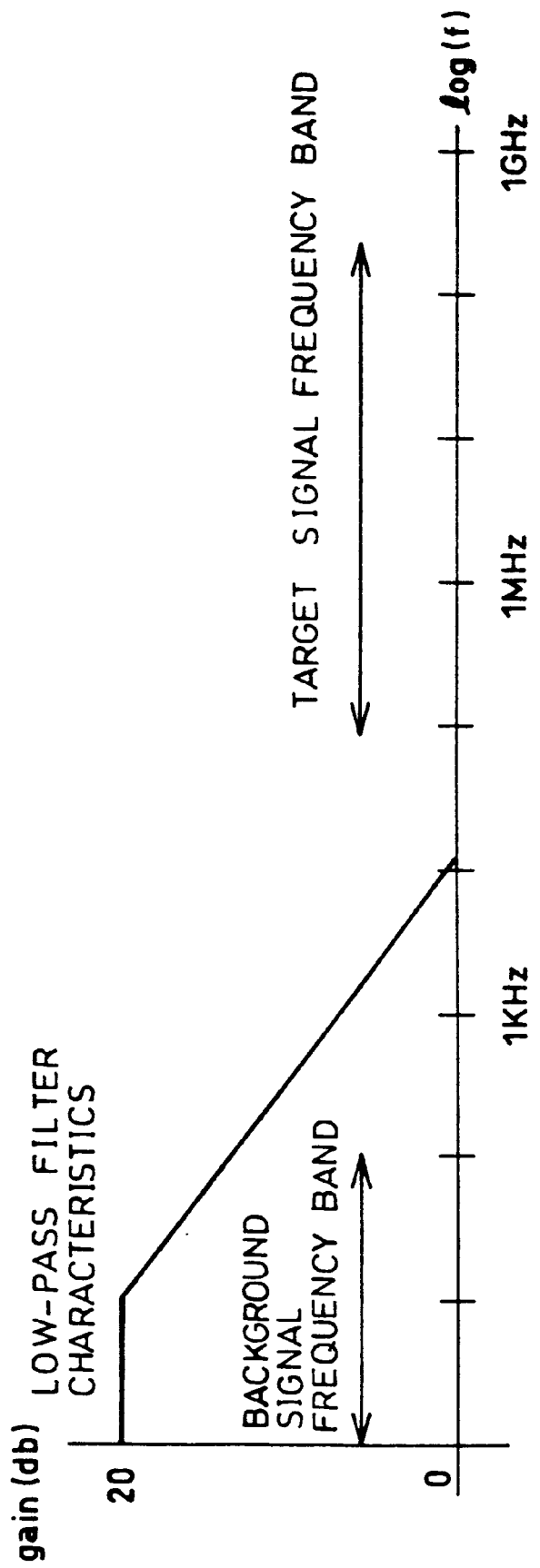
FIG. 2 is a graph of a frequency spectrum of a signal processing device in accordance with the present invention.

As illustrated in FIG. 2, the target signal has a frequency band of, for example, several hundred kHz to several hundred MHz, whereas the adaptive control signal has a frequency band of DC to about 1 kHz, corresponding to the background signal. By using the adaptive control signal having such a frequency band sufficiently separate from the frequency band of the target signal, it is possible to carry out the signal processing operation while adapting the signal processing unit 21 to changes of the background signal, thereby making the DC level of the output signal Vout stable.

Figure 3:
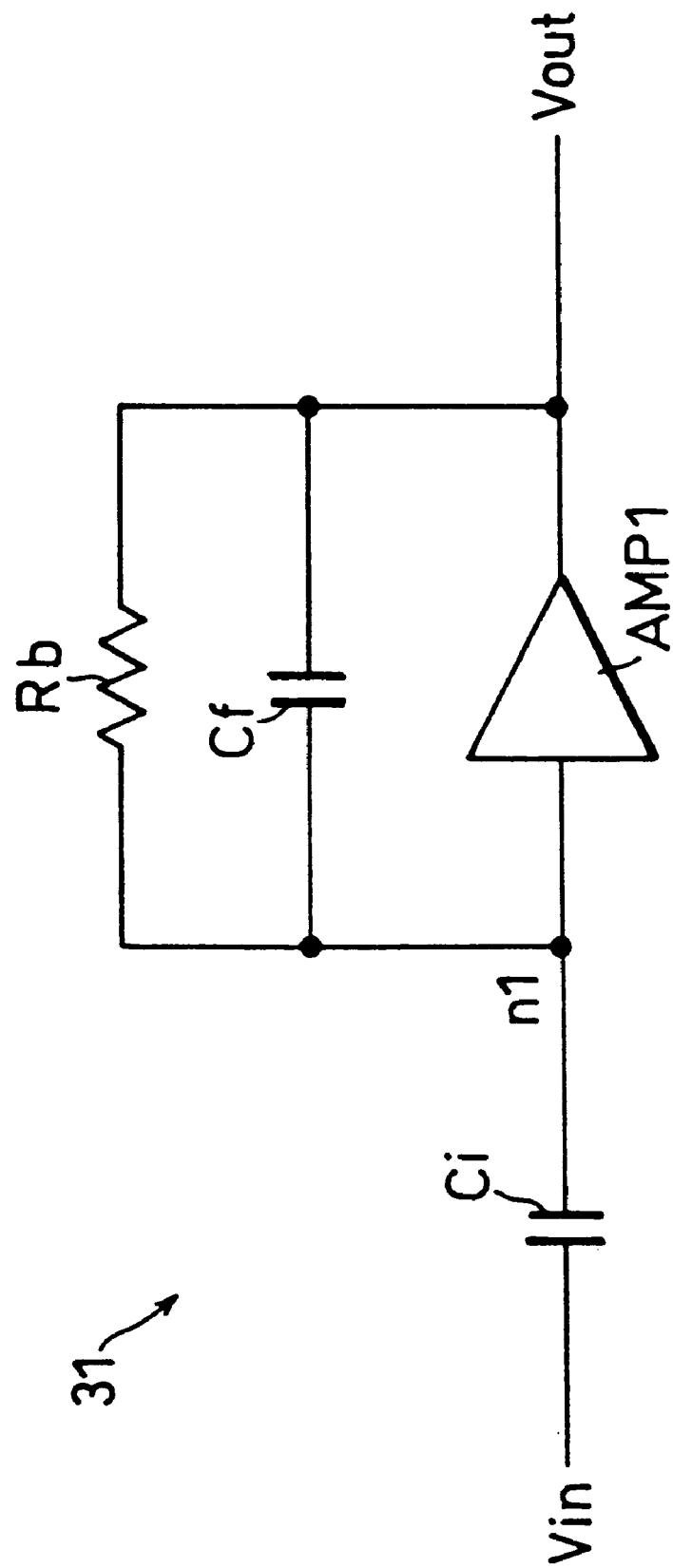
FIG. 3 is an electric circuit diagram of an analog signal processing circuit arranged in accordance with a first embodiment of the present invention.

FIG. 3 is an electric circuit diagram of a concrete example of an analog signal processing circuit 31 arranged in accordance with the first embodiment of the present invention. The analog signal processing circuit 31 is realized by adding an adaptive-control-use resistor Rb (feedback resistor) having a high resistance to a capacitive-coupling-type analog signal processing circuit having an amplifier AMP1, an input capacitor Ci, and a feedback capacitor Cf. Therefore, a set of the amplifier AMP1, the input capacitor Ci, and the feedback capacitor Cf corresponds to the signal processing system composed of the signal processing unit 21, while a set of the feedback capacitor Cf and the resistor Rb corresponds to the adaptive control system composed of the comparator 22 and the low-pass filter 23.

Let a resistance of the resistor Rb and a capacitance of the feedback capacitor Cf be Rb and Cf, respectively, then the low-pass filter 23 has a cut-off frequency fc expressed as:

$$fc = 1/(2\pi RbCf) \quad (5)$$

Here, in this invention, the resistance Rb and the capacitance Cf are set so that a product of the two is not less than $10^{-4}$ seconds.

By doing so, for example, in the case where the capacitance of the feedback capacitor is in the order of pF ($10^{-12}$), the resistor Rb has a resistance of not less than $10^8$ Ω, thereby resulting in that the adaptive control system has the cut-off frequency fc of not more than 1.5 kHz. Thus, the adaptive control system can be arranged so as to have a frequency band sufficiently separate from the target signal components of around several hundred MHz. Therefore, it is possible to compensate a change of the background voltage included in the input signal and a shift of a reference level $V_0$ of the output signal from the threshold level (threshold voltage Vth), without affecting the target signal components to be processed.

More specifically, for example, in the case where Cf=0.2 pF ($=2\times 10^{-13}$ F), the resistance of the resistor Rb is set not less than 500 MΩ according to the above relation. Then, by using the formula (S), the cut-off frequency fc is found as:

$$fc = 1/(2\times \pi \times 5\times 10^8 \times 2\times 10^{-13}) \approx 160 \text{ Hz} \quad (6)$$

In the analog signal processing circuit 31 thus arranged, let a gain of the amplifier AMP1 be −G1 (G1>0), and an operating point voltage thereof be Vr1, then input/output characteristics of the amplifier AMP1 are expressed as:

$$Vout - Vr1 = -G1(Vn1 - Vr1) \quad (7)$$

wherein Vn1 is a potential at the node n1.

Herein, in the case where a time constant determined by the capacitor Ci and the resistor Rb is sufficiently great, as compared with a period of the target signal included in the input signal Vin, an influence of a high resistance of the resistor Rb on the analog signal processing circuit 31 can be neglected. In this case, taking static characteristics in consideration, Vn1=Vout is satisfied.

Therefore, in the case where the analog signal processing circuit 31 stably functions, the DC level of the output signal Vout is converged to the operating point voltage Vr1, irrelevant to a level of the background voltage included in the input signal Vin. Here, input/output characteristics of the circuit shown in FIG. 3 in the frequency band of the target signal are expressed as:

$$Vout - Vr1 = -(Ci/Cf)(Vin - Vin^{DC}) \quad (8)$$

where $Vin^{DC}$ represents a level of the background signal of the input signal Vi (hereinafter referred to as background voltage $V_{in}^{DC}$). From this, it is understood that the analog signal processing circuit 31 serves as a multiplier for multiplying the target signal components in the input signal Vin by $-(C_i/C_f)$.

Thus, by providing the resistor Rb in parallel with the feedback capacitor Cf, the adaptive control signal having a frequency band sufficiently separate from the frequency band of the target signal is negatively fed back, while the amount of charges at the node n1 as the input end of the amplifier AMP1 is controlled, thereby causing the DC level of the output signal Vout to be kept at the level of the operating point voltage Vr1. Thus, with the signal processing operation continued, the analog signal processing unit 31 is adapted to changes of the background signal which is composed of DC or low frequency components in the input signal Vin.

Therefore, without affecting the signal processing operation, the refreshing operation, which is mentioned in the description on the background of the invention, can be carried out at the same time. Therefore, a device incorporating the analog signal processing circuit 31 is not required to use a spare circuit. As a result, the size of the circuit and the power consumption can be reduced, noises caused by switching the circuits by no means occur, and a system such as a clock oscillating circuit for carrying out complicated switching operations can be omitted.

According to estimation by the inventor of the present invention, an area of the circuit and power consumed by the circuit can be reduced by about 30 percent.

The following description will explain a variation of the present embodiment.

Figure 4:
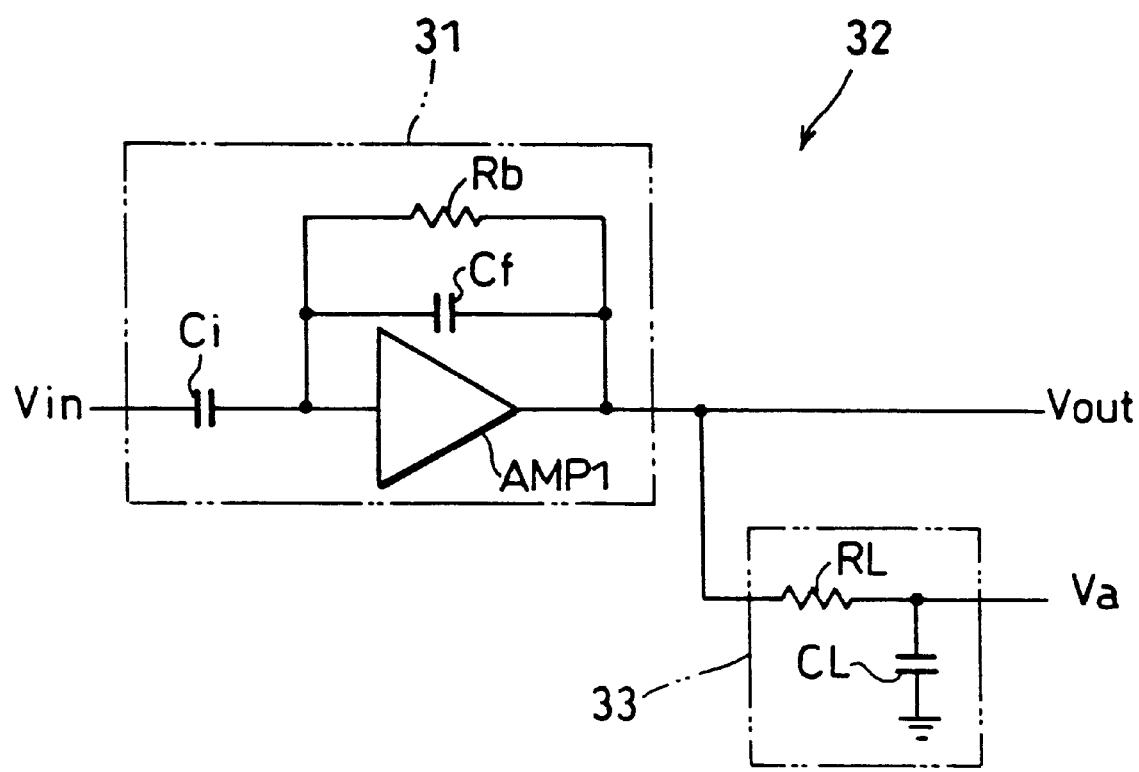
FIG. 4 is an electric circuit diagram of an analog signal processing circuit in accordance with a variation of the first embodiment.

FIG. 4 is an electric circuit diagram of a concrete example of an analog signal processing circuit 32 in accordance with the present variation. As to the analog signal processing circuit 31 shown in FIG. 3, a DC level of the output signal Vout is the operating point voltage Vr1 of the amplifier AMP1. The operating point voltage Vr1 does not coincide with an operating point on design, which is given as Vr, due to variation occurring in the process of manufacturing LSIs. This difference between Vr and Vr1 is significant in evaluating the output signal Vout. The analog signal processing circuit 32 is composed of the analog signal processing circuit 31 and a low-pass filter 33. The low-pass filter 33 is composed of a resistor RL and a capacitor CL, so as to extract low frequency components from an output of the analog signal processing circuit 31.

A cut-off frequency of the low-pass filter 33 is set sufficiently low so as not to pass components having frequencies in the signal frequency band. In the case where the background voltage of the input signal is constant, an output Va of the low-pass filter 33 is constant, being coincident with the operating point voltage Vr1. Therefore, a difference (Vout-Va) between the output signal Vout of the analog signal processing circuit 31 and the output Va of the low-pass filter 33 is a voltage obtained by multiplying an inputted signal component by $-C_i/C_f$, irrelevant to the operating point voltage of the amplifier AMP1.

Figure 5:
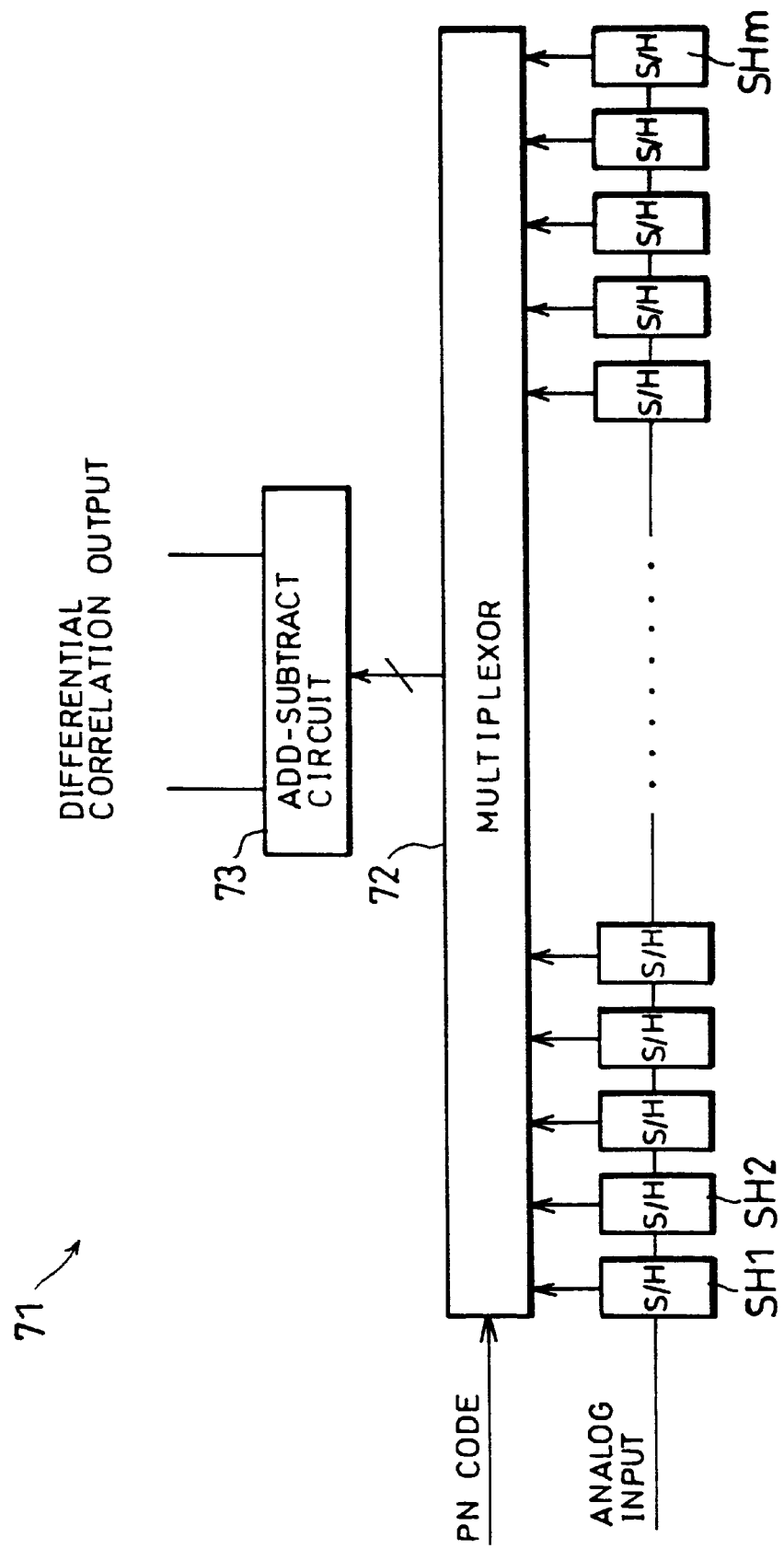
FIG. 5 is a block diagram illustrating an electric arrangement of a matched filter to which the analog signal processing circuits of FIG. 4 are adopted.

FIG. 5 is a block diagram of an arrangement of a matched filter 71 to which the analog signal processing circuits 32 of FIG. 4 are adopted. In the matched filter 71, sequential sampling operations by sample and hold circuits SH1, SH2, . . . SHm (hereinafter referred to as sample and hold circuits SH collectively) are carried out with respect to an analog input signal. A multiplexor 72 is controlled in accordance with the PN code so as to selectively supply respective outputs of the sample and hold circuits SH to either an adding section or a subtracting section of an add-subtract unit 73.

Figure 6:
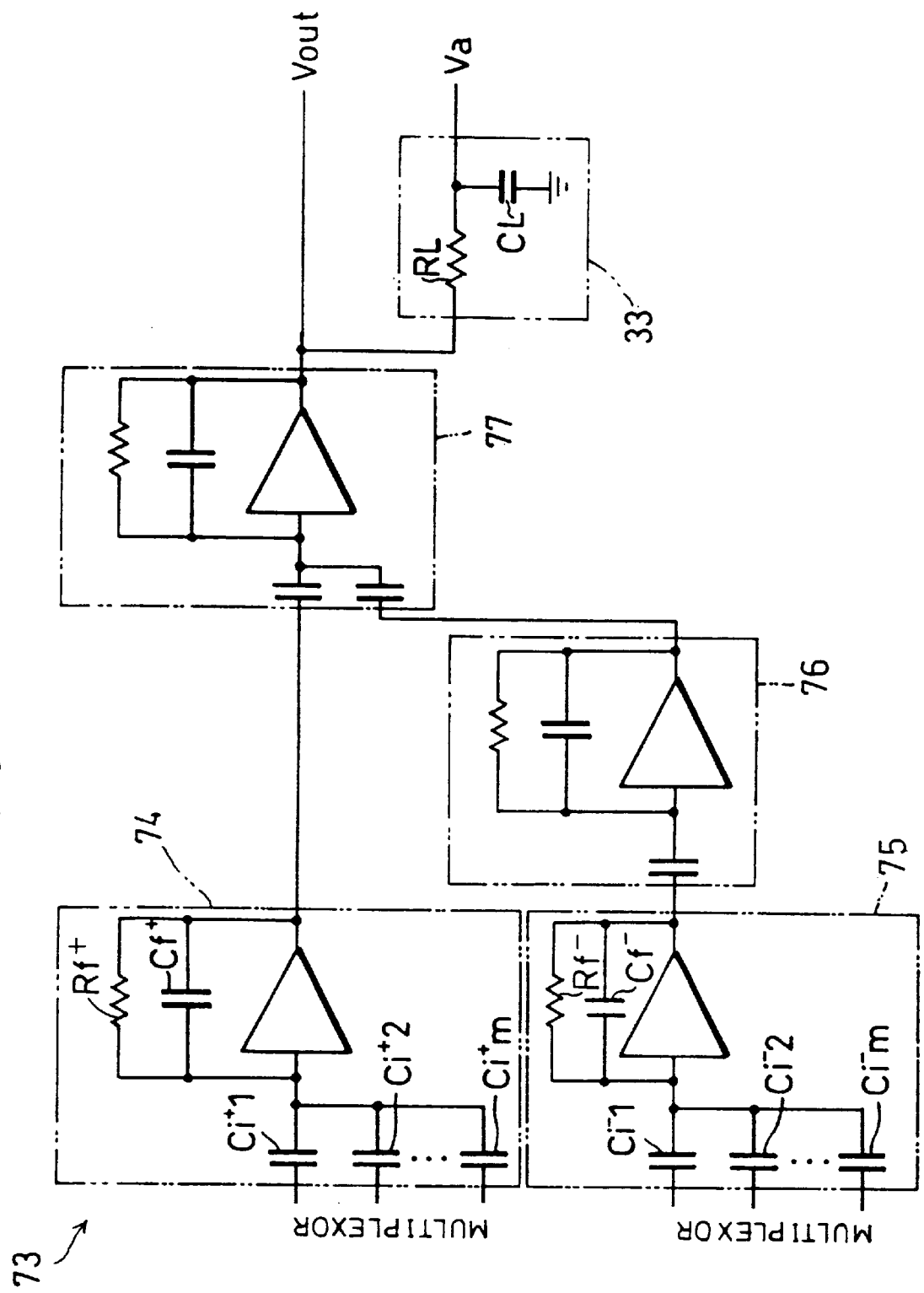
FIG. 6 is a block diagram illustrating a concrete example of an arrangement of an add-subtract circuit in a matched filter, in the case where the analog signal processing circuits shown in FIG. 4 are used in the add-subtract circuit.

The add-subtract unit 73 is composed of two product adders 74 and 75, an inverter 76, and an adder 77, as illustrated in FIG. 6. To the product adders 74 and 75, inputs are supplied from the sample and hold circuits SH through the multiplexor 72. The product adder 74 is composed of input capacitors $C_i^+1$, $C_i^+2$, . . . , $C_i^+m$ (hereinafter collectively referred to as input capacitors $C_i^+$) having respective positive coefficients in accordance with the PN code. The product adder 74 multiplies the output voltages of the sample and hold circuits SHi respectively corresponding to the positive PN code by respective capacitance ratios $C_i^+/C_f^+$ relating to the input capacitors $C_i^+$ and the feedback capacitor $C_f^+$ as coefficients, and adds the multiplied results to each other, thereby outputting the added result.

On the other hand, the product adder 75 is composed of input capacitors $C_i^-1$, $C_i^-2$, . . . , $C_i^-m$ (hereinafter collectively referred to as input capacitors $C_i^-$) having respective negative coefficients in accordance with the PN code. The product adder 75 multiplies the outputs parallely supplied from the sample and hold circuits SHi respectively corresponding to the negative PN code by respective negative coefficients $C_i^-/C_f^-$, and adds the multiplied results to each other, thereby outputting the added result. Note that as to each pair of the input capacitors having the same reference numeral but + and − respectively, for example, $C_i^+1$ and $C_i^-1$, an output of the sample and hold circuit SHi is supplied to either of them while the reference voltage is supplied to the other.

The output of the product adder 75 is inverted by the inverter 76, and the inverted result is added to the output of the product adder 74 by the adder 77. By using as differential signals the output Vout of the adder 77 and the output Va obtained by filtering the output Vout through the low-pass filter 33, the add-subtract unit 73 functions without being affected by variation of the operating point voltage of the analog signal processing circuits 32 respectively constituting the product adders 74 and 75, the inverter 76, and the adder 77.

Furthermore, since the analog signal processing circuit 32 in the add-subtract unit 73 of the matched filter 71 is capable of carrying out the refreshing operation and the signal processing operation in parallel as the analog signal processing circuit 31 described above, the matched filter 71 does not require the add-subtract circuit 13 and the multiplexor 15, which are indispensable in the matched filter 11.

With this arrangement, it is possible to provide a correlation computing device such as a matched filter wherein products of sampled values of the received signal and the coefficients in accordance with the PN code of the matched filter are summed and detection of a peak value of the summed results marks the coincidence between the PN code thereof and the PN code of the received signal, thereby ensuring synchronization. The correlation computing device thus arranged is used in a demodulator circuit of a code division multiple access (CDMA) system, which is installed in a digital automotive telephone or a digital pocket telephone.

Note that instead of the analog signal processing circuits 32, analog signal processing circuits 41, 51, and 61 described later are adoptable to the add-subtract circuit 73, and so is the analog signal processing circuit 31 described above.

The following description will explain a second embodiment of the present invention, while referring to FIGS. 7 through 12.

Figure 7:
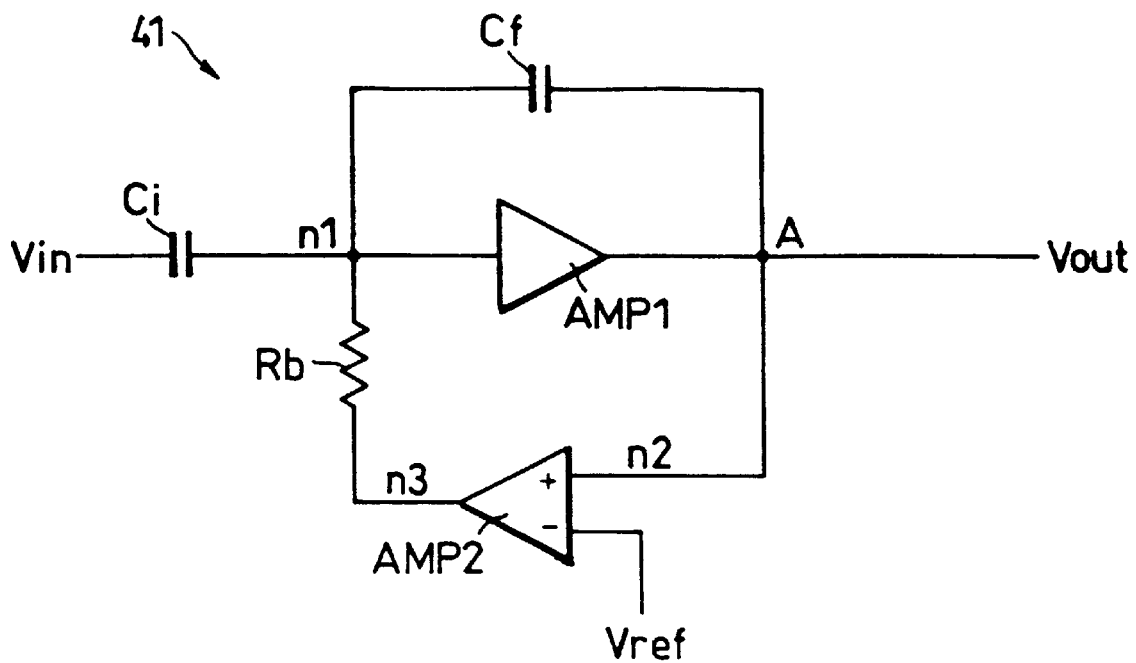
FIG. 7 is an electric circuit diagram of an analog signal processing circuit arranged in accordance with a second embodiment of the present invention.

FIG. 7 is an electric circuit diagram of an analog signal processing circuit 41 in accordance with the second embodiment of the present invention. In the analog signal processing circuit 41, the members having the same structure (function) as those in the analog signal processing circuit 31 will be designated by the same reference numerals and their description will be omitted.

The analog signal processing circuit 41 is an analog voltage multiplying unit having an amplifier AMP 1 which is an inverting amplifier, and capacitors Ci and Cf. What is noticeable is that the analog signal processing circuit 41 has an amplifier AMP2 which corresponds to the comparator 22. The amplifier AMP2, being a differential amplifier, is arranged so that an output signal Vout is supplied to a non-inverting input terminal thereof while a reference voltage Vref having a predetermined value is supplied to an inverting input terminal thereof. The amplifier AMP2, thus arranged, negatively feeds back an adaptive control signal corresponding to a shift of the DC level of the output signal Vout from the reference voltage Vref, to a node n1 via a resistor Rb having a high resistance.

In the analog signal processing circuit 41 thus arranged, input/output characteristics of the amplifier AMP1 are expressed by the formula (8). Herein, assume that a time constant determined by the capacitor Ci and Cf and the resistor Rb is sufficiently great, while an influence of the high resistance of the resistor Rb on the analog signal processing circuit 41 can be neglected. Let a gain of the amplifier AMP2 be G2 (G2>0), an operating point voltage thereof be Vr2, a potential at a node n2 serving as the non-inverting input end of the amplifier AMP2 be Vn2, and a potential at a node n3 serving as an output end thereof be Vn3, then, input/output characteristics of the amplifier AMP2 are expressed as:

$$Vn3 - Vr2 = G2(Vn2 - Vr2) \quad (9)$$

Here, the following is satisfied:

$$Vr2 = Vref + Voff2 \quad (10)$$

where Voff2 represents an input off-set voltage of the amplifier AMP2. Besides, Vn1=Vn3 is satisfied when static characteristics are taken in consideration. Therefore, by substituting these in the formulas (7) and (9) so as to eliminate Vn1, the following is found:

$$\begin{aligned}
Vout &= \frac{G1 \cdot G2 \cdot Vr2 + G1 \cdot (Vr1 - Vr2) + Vr1}{1 + G1 \cdot G2} \\
&= \frac{G1 \cdot G2}{1 + G1 \cdot G2} Vr2 + \frac{G1}{1 + G1 \cdot G2}(Vr1 - Vr2) + \\
&\quad \frac{G1}{1 + G1 \cdot G2} Vr1 \\
&\approx Vr2
\end{aligned} \quad (11)$$

Note that the rightmost side of the equation is obtained by approximation, by assuming that G1 and G2 are sufficiently great, for example, not less than 100.

Therefore, in the case where the analog signal processing circuit 41 stably functions, the DC level of the output signal Vout is converged to a constant value, irrelevant to a background voltage $Vin^{DC}$ of the input signal Vin. In this case, in the frequency band of the target signal the amplifier AMP2 has input/output characteristics expressed as:

$$Vout - Vr2 = -(Ci/Cf)(Vin - Vin^{DC}) \quad (12)$$

Therefore, from this, it is understood that the analog signal processing circuit 41 serves as a multiplier for multiplying the target signal components in the input signal Vin by $-(Ci/Cf)$. Besides, in the case where the input off-set voltage Voff2 of the amplifier AMP2 is sufficiently small, the formula (12) is transformed to the following formula (13) by approximation:

$$Vout - Vref = -(Ci/Cf)(Vin - Vin^{DC}) \quad (13)$$

From this, it is understood that the DC level of the output signal Vout is always adapted to the reference voltage Vref under the above-described condition.

Figure 8:
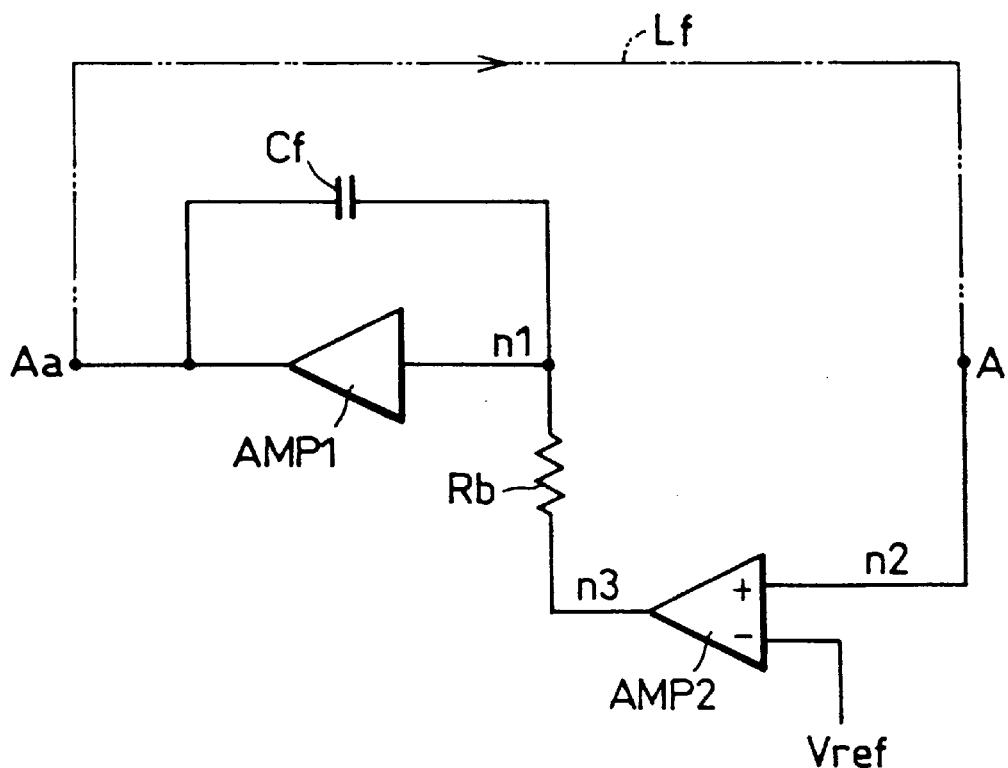
FIG. 8 is a view illustrating characteristics of an adaptive control system of the analog signal processing circuit shown in FIG. 7.

The following description will discuss requirements for a stable signal processing operation in the case where the amplifier AMP2 is adopted to the adaptive control system. The feedback system for the low-frequency background signal included in the output signal Vout is taken out of the circuit shown in FIG. 7, and a circuit obtained by transforming the feedback system so that the node A is an input side while a node Aa is an output side is shown in FIG. 8.

Transfer characteristics from a potential Vn3 at the node n3 serving as an output end of the amplifier AMP2 to a potential at the node A are equivalent to characteristics of a first-order-type RC low-pass filter composed of a resistor Rb having a high resistance and a feedback capacitor Cf, though differing from each other in signs. Let a cut-off frequency of the low-pass filter be f2, then f2 is given as:

$$f2 = 1/(2\pi Rb Cf) \quad (14)$$

Therefore, the signal supplied to the node A is outputted to the node Aa through the amplifier AMP2 having a DC gain −G2 and the RC filter having a cut-off frequency f2, and thereafter, it is fed back through a feedback line Lf to the node A. In order to make such a feedback circuit stably function, it is required that at a frequency at a unity gain of the circuit as a whole (gain: 1 (0 dB)), a phase lag should be less than 180°. This requirement is satisfied by setting parameters of the circuit shown in FIG. 8 so that the following is satisfied:

$$f2 \cdot G2 < fp \quad (15)$$

wherein fp represents the lower of a frequency at a pole p1 of the amplifier AMP1 and a frequency at a pole p2 of the amplifier AMP2.

Figure 9:
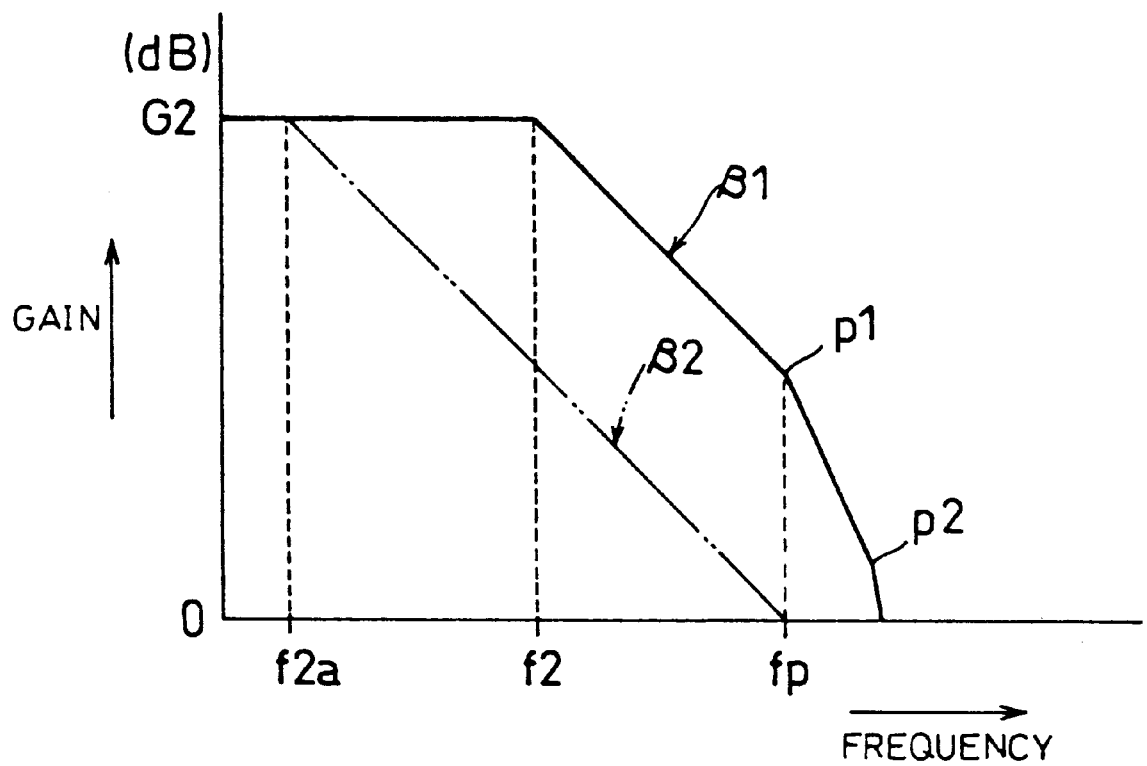
FIG. 9 is a graph of frequency characteristics for explaining requirements in design of the adaptive control system of the analog signal processing circuit shown in FIG. 7.

To be more specific, in the case where frequency characteristics of the circuit as a whole are as indicated by a line designated by a reference code β1 in FIG. 9, the cut-off frequency should be shifted from f2 to f2a by setting the resistance of the resistor Rb and the capacitance of the feedback capacitor Cf, as indicated by a line designated by a reference code β2, so that the requirement that the frequency at the unity gain is lower than the frequency fp is satisfied. Note that in an actual design for practical application, in order to ensure that the above-described requirement is satisfied, the resistance and the capacitance are set so that not the formula (15) but the following formula (16) is satisfied:

$$3 \cdot f2 \cdot G2 < fp \quad (16)$$

For example, assume that a unity gain frequency of the amplifier AMP2 is 80 MHz and a DC gain is 60 dB, then a frequency at the pole p1 is found as:

$$p1 = 80/60 \approx 1.3 \text{ MHz} \quad (17)$$

Figures 10A, 10B:
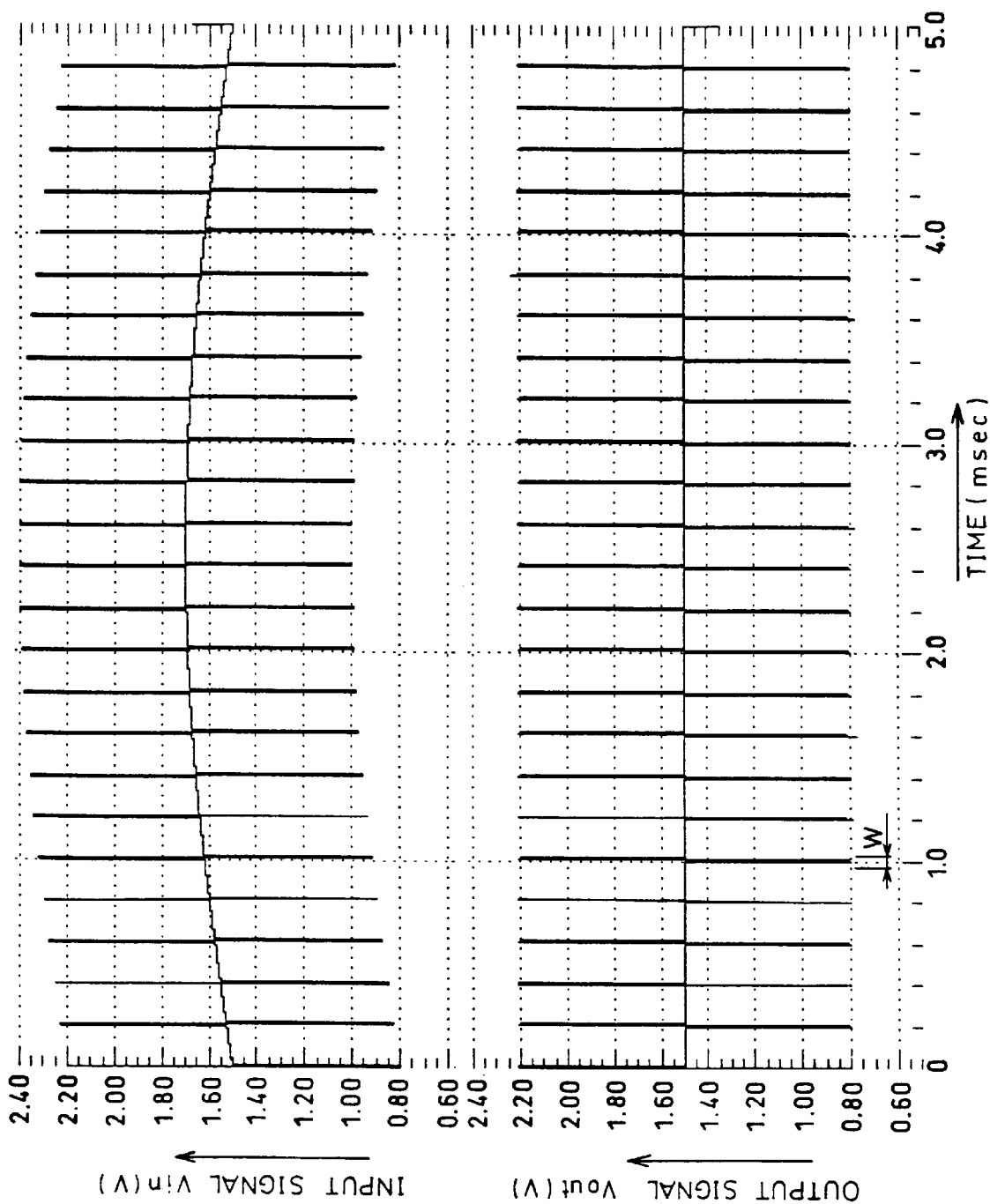
FIG. 10(*a*) is a waveform chart of an input signal for explaining an adaptive control operation of the analog signal processing circuit shown in FIG. 7.

FIGS. 10(a) and 10(b) are waveform charts for explaining operations of the analog signal processing circuit 41 arranged described above. Herein, as to the parameters of the circuit, Ci=Cf=0.2 pF, Rb=5 GΩ, G1=1000, G2=200, $V_{DD}$=3V, and Vref=1.5V.

Figures 11A, 11B:
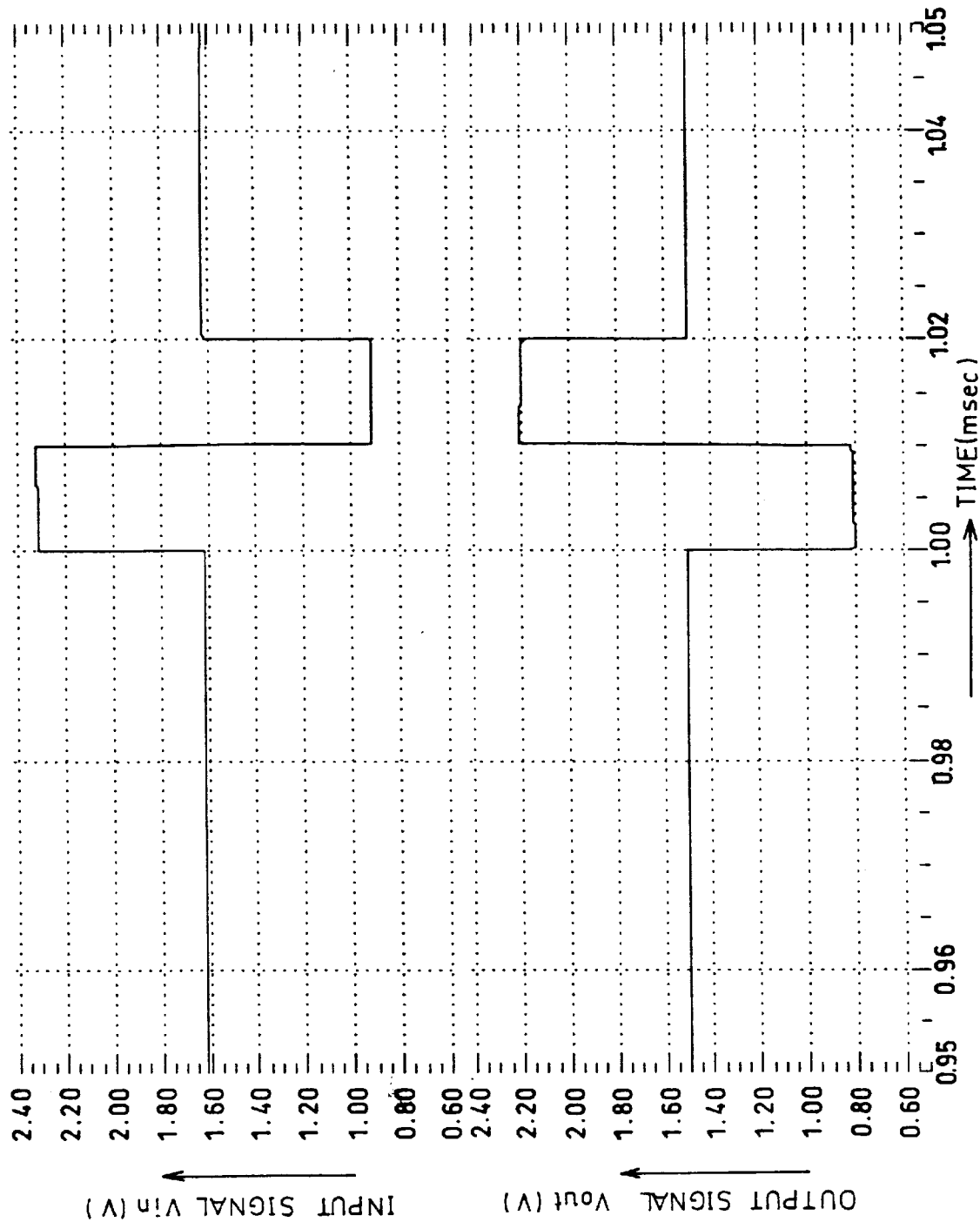
FIGS. 11(*a*) and 11(*b*) are waveform charts illustrating enlarged portions of the waveform charts of FIGS. 10(*a*) and 10(*b*), respectively.
Figure 12:
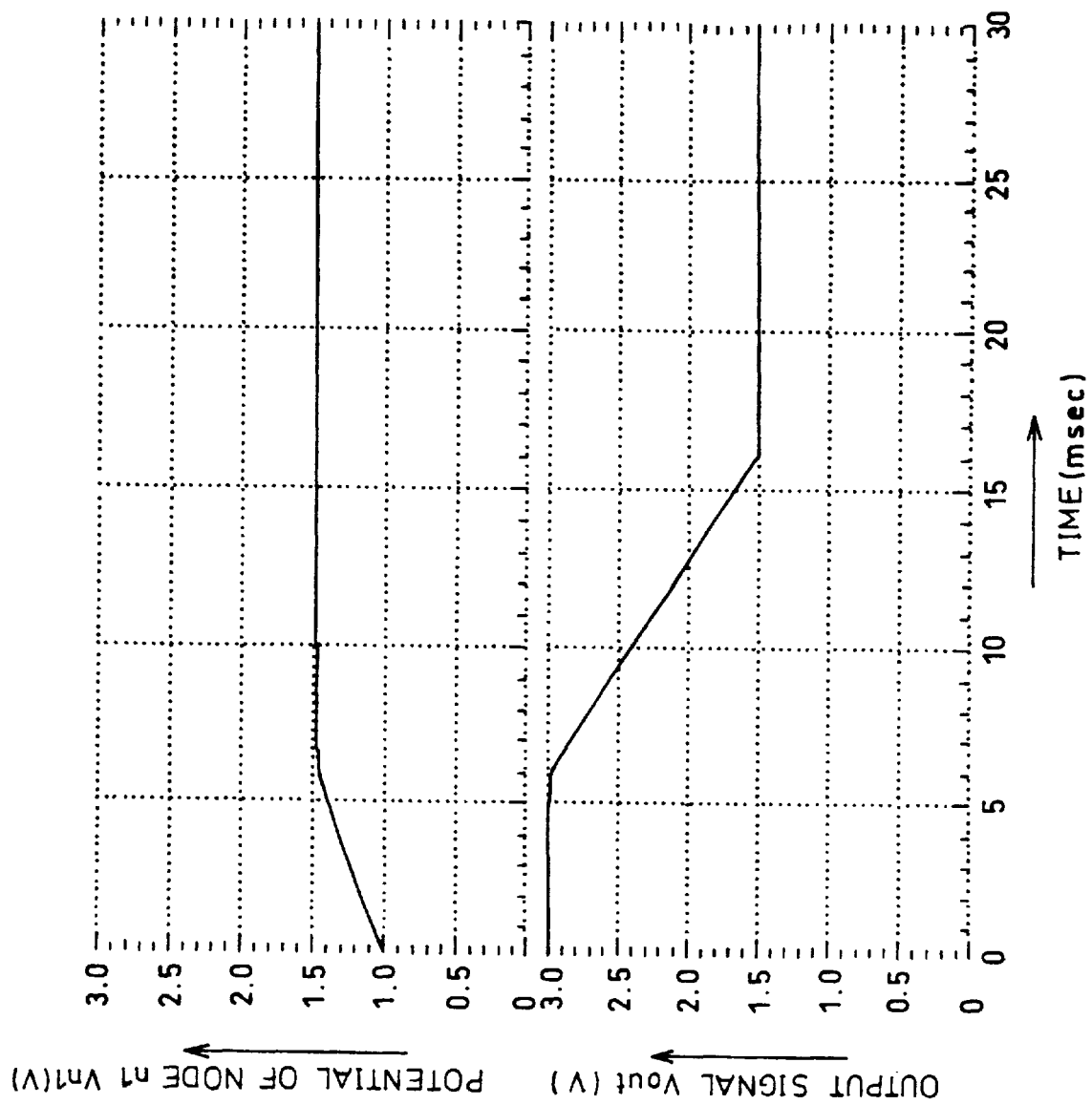
FIG. 12(a) is a waveform chart illustrating a potential at a node n1, for explaining an initializing operation of the signal processing circuit of FIG. 7 just after power supply starts.
FIG. 12(b) is a waveform chart illustrating an output signal, for explaining an initializing operation of the signal processing circuit of FIG. 7 just after power supply starts.

FIGS. 10(a) and 10(b) illustrate the input signal Vin and the output signal Vout, respectively, which are obtained under a condition that, so that the operations is easily understood, the input signal Vin has a target signal frequency set to 5 kHz and the background signal has a sinusoidal waveform with a frequency of 100 Hz. Enlarged views of waveform portions during a period designated by W in FIGS. 10(a) and 10(b) are shown in FIGS. 11(a) and 11(b), respectively. As clear from the figures, the DC level of the output voltage is adjusted in accordance with voltage level changes of the background signal taking place at a sufficiently low frequency as compared with the target signal frequency, thereby being always stable at a level of the reference voltage Vref, which is set to 1.5 V in this case.

Thus, a product of the gain of the amplifier AMP2 (comparator 22) and the frequency of the adaptive control signal (cut-off frequency of the low-pass filter) is set lower than the lower between of the frequency at the pole of the amplifier AMP1 and the frequency at the pole of the amplifier AMP2. Therefore, even in the case where an adaptive control circuit which negatively feeds back a low frequency component of an output signal of an amplifier by a desired gain to the input end of the amplifier is provided in the circuit, oscillation due to the adaptive control circuit does not occur since a phase difference of the adaptive control signal with respect to the input signal is less than 180°.

FIGS. 12(a) and 12(b) show an initializing operation when power supply starts. Since in the analog signal processing circuit 41 the node n1 is connected to the node n3 through the resistor Rb, a potential difference is caused between the node n1 and the node n3 in a state where the circuit is not connected to the power supply, due to a potential at the node n3 which depends on charges accumulated in stray capacitance of the node n3. This potential difference causes changes in the amount of charges in the node n1.

Therefore, when power supply starts, the DC level of the output signal Vout is not the level of the reference voltage Vref, that is, 1.5V, as illustrated in FIG. 12(b). But, as the potential of the node n1 rises as shown in FIG. 12(a), the DC level of the output signal Vout is converged to the level of the reference voltage Vref, that is, 1.5 V. Herein, assume that the input signal Vin is a constant DC voltage, in the case of FIG. 12(b).

Thus, while in the analog signal processing circuit 31, the specific operating point voltage Vr1 of the amplifier AMP1 corresponds to the threshold voltage Vth, in the analog signal processing circuit 41, the reference voltage Vref whose value is desirably set corresponds to the threshold voltage Vth. Therefore, in the case where the analog signal processing circuits 41 are used for a plurality of channels in parallel, each DC level of the output signals Vout is made to coincide with a desired level, thereby ensuring that signal processing operations afterwards, including an operation for checking whether or not the output signal coincides with the reference voltage, are carried out with high precision.

Figure 13:
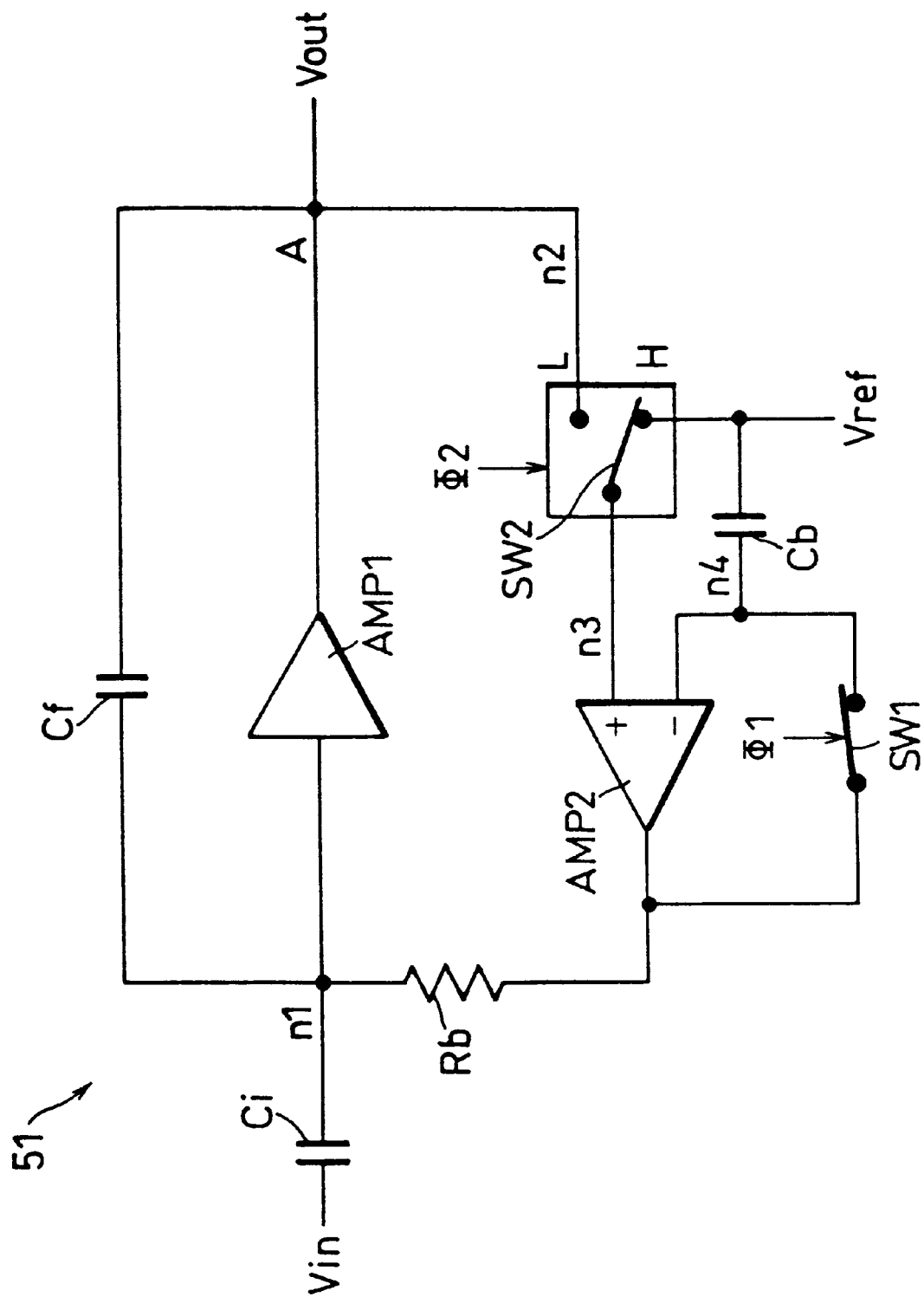
FIG. 13 is an electric circuit diagram of an analog signal processing circuit arranged in accordance with a third embodiment of the present invention.

FIG. 13 is a circuit diagram of an analog signal processing circuit 51 in accordance with a third embodiment of the present invention. In the analog signal processing circuit 51, the members having the same structure (function) as those in the analog signal processing circuit 41 will be designated by the same reference numerals and their description will be omitted.

What is noticeable is that a reference voltage Vref is supplied to an inverting input terminal of an amplifier AMP2 through an input coupling capacitor Cb, and that switches SW1 and SW2 are provided. The switch SW1 connects or disconnects the inverting input terminal and an output terminal of the amplifier AMP2, while the switch SW2 selectively supplies either the output signal Vout or the reference voltage Vref to the non-inverting input terminal of the amplifier AMP2.

The amplifier AMP2 has a MOSFET as its input stage, while a node n4 on a side to the inverting input terminal has an extremely high impedance in a state where the switch SW1 is off. When a control signal Φ1 for controlling the switch SW1 shifts to a high level thereby closing the switch SW1 and a control signal Φ2 for controlling the switch SW2 shifts to a high level thereby causing the reference level Vref to be supplied to a node n3 on a side to the non-inverting input terminal of the amplifier AMP2, charges expressed as Cb·Voff2 are accumulated at the node n4, where Voff2 represents an input off-set voltage of the amplifier AMP2.

Thereafter, the control signal Φ1 shifts to a low level thereby causing the switch SW1 to go off, and the charges accumulated at the node n4 are kept therein. Subsequently, the control signal Φ2 shifts to a low level, thereby causing the output signal Vout to be sent to the amplifier AMP2 through the switch SW2, and when the feedback system shifts by the off-set voltage Voff2 into an operating state, the reference voltage Vref shifts due to the charges Cb·Voff2 accumulated at the node n4, and the reference voltage Vref thus having the shift is supplied to the amplifier AMP2.

In the analog signal processing circuit 41, the DC level of the output signal Vout shifts from the level of the reference voltage Vref by the input off-set voltage Voff2 of the amplifier AMP2. On the other hand, with the analog signal processing circuit 51, wherein the shift equivalent to the off-set voltage Voff2 is compensated, it is possible to carry out the signal processing operation with higher precision.

Note that, as described in relation to the prior art, even when the switch SW1 goes off, it is impossible to keep the amount of charges at the node n4 to a constant level for a long period of time, due to leak current. However, in the present embodiment, it is possible to carry out the compensating operation periodically, for example, at every 1 kHz, that is, at every 1 msec, and finish the operation within a period of several μsec each time. This operating period is extremely short, as compared with the time constant of the feedback system of the amplifier AMP2, that is, $10^{-4}$ sec, and hence the compensating operation does not affect the adaptive control operation. Therefore, by carrying out the off-set voltage compensating operation while the signal processing operation is continuously carried out, it is possible to carry out the adaptive control operation so that the output voltage Vout coincides with the desirable reference voltage Vref.

As described above, during the refreshing operation of the adaptive control system, the reference voltage Vref is supplied through the switch SW2 to the input end (non-inverting input end) of the amplifier AMP2 and the switch SW1 directly connects the output end of the amplifier AMP2 with the input end (inverting input end) of the amplifier AMP2. Therefore, the output end of the amplifier AMP2 and the input end thereof for the reference voltage Vref have the same potential. As a result, across the terminals of the input coupling capacitor Cb, one terminal being connected to the input end of the amplifier AMP2 for the reference voltage Vref while to the other the reference voltage Vref being supplied, a potential difference corresponding to the input off-set voltage Voff2 of the amplifier AMP2 took place. Therefore, charges corresponding to the input off-set voltage Voff2 are accumulated in the input coupling capacitor Cb.

On the other hand, during the normal signal processing operation, the output signal Vout of the amplifier AMP1 is supplied to the non-inverting input end of the amplifier AMP2 through the switch SW2, while the reference voltage Vref is supplied to the inverting input end thereof through the input coupling capacitor Cb. The output end of the amplifier AMP2 is connected to the input end of the amplifier AMP1 through the resistor Rb.

Therefore, during the signal processing operation, the reference voltage Vref, which has been shifted by the input coupling capacitor Cb with a shift corresponding to the input off-set voltage Voff2 of the amplifier AMP2, is inputted to the amplifier AMP2. Thus, the input off-set voltage Voff2 of the amplifier AMP2 is compensated.

Figure 14:
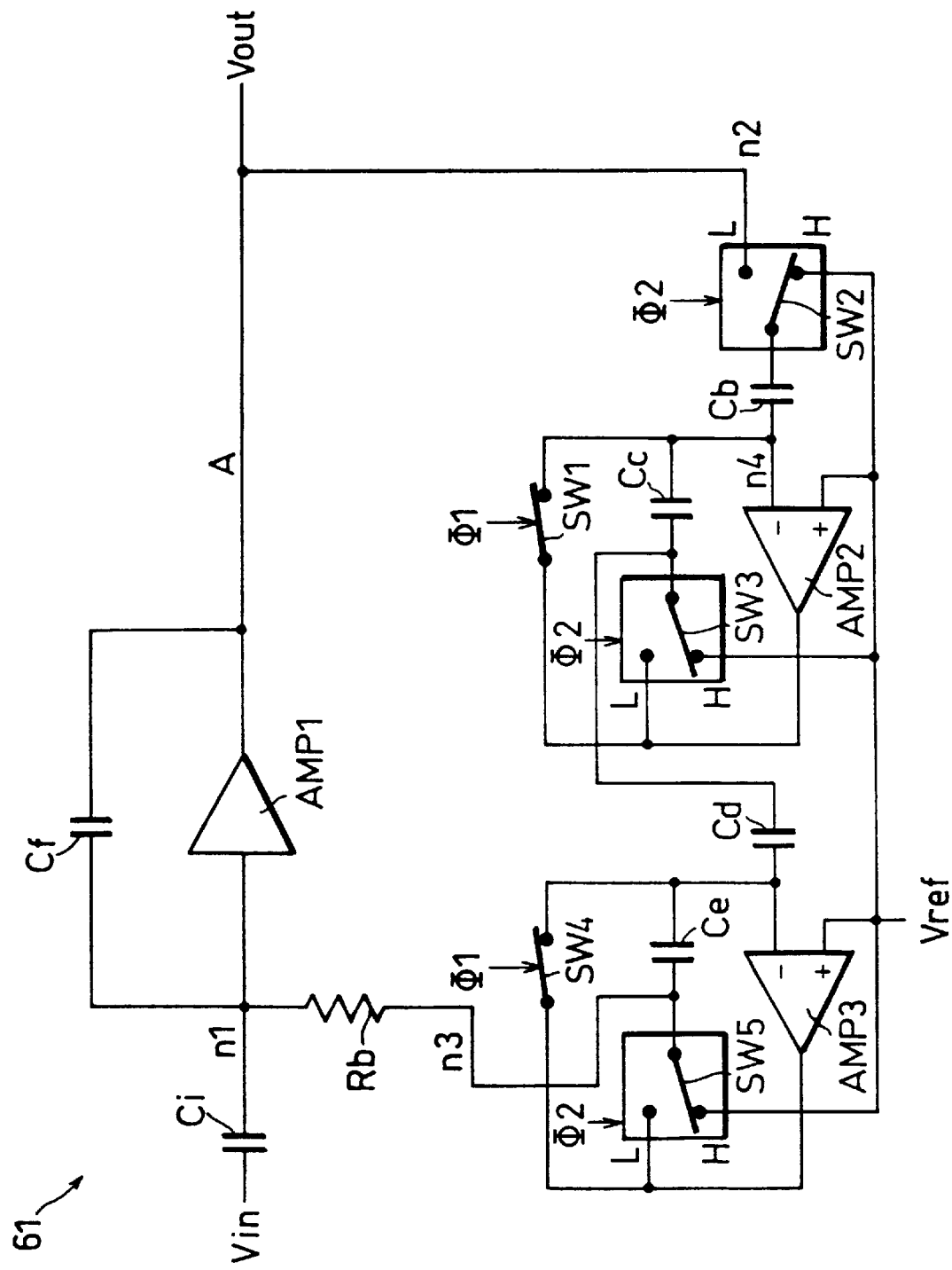
FIG. 14 is an electric circuit diagram of an analog signal processing circuit arranged in accordance with a fourth embodiment of the present invention.
Figure 15:
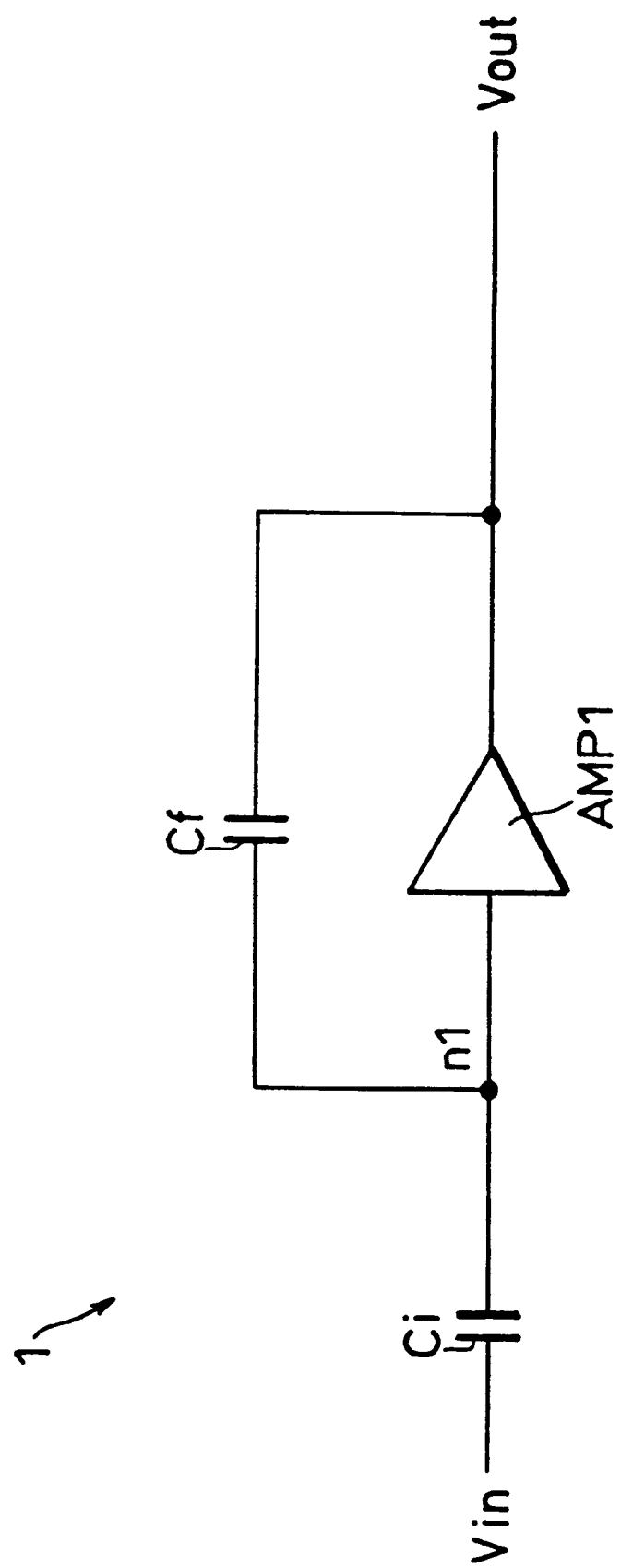
FIG. 15 is an electric circuit diagram of a basic analog signal processing circuit.
Figure 16:
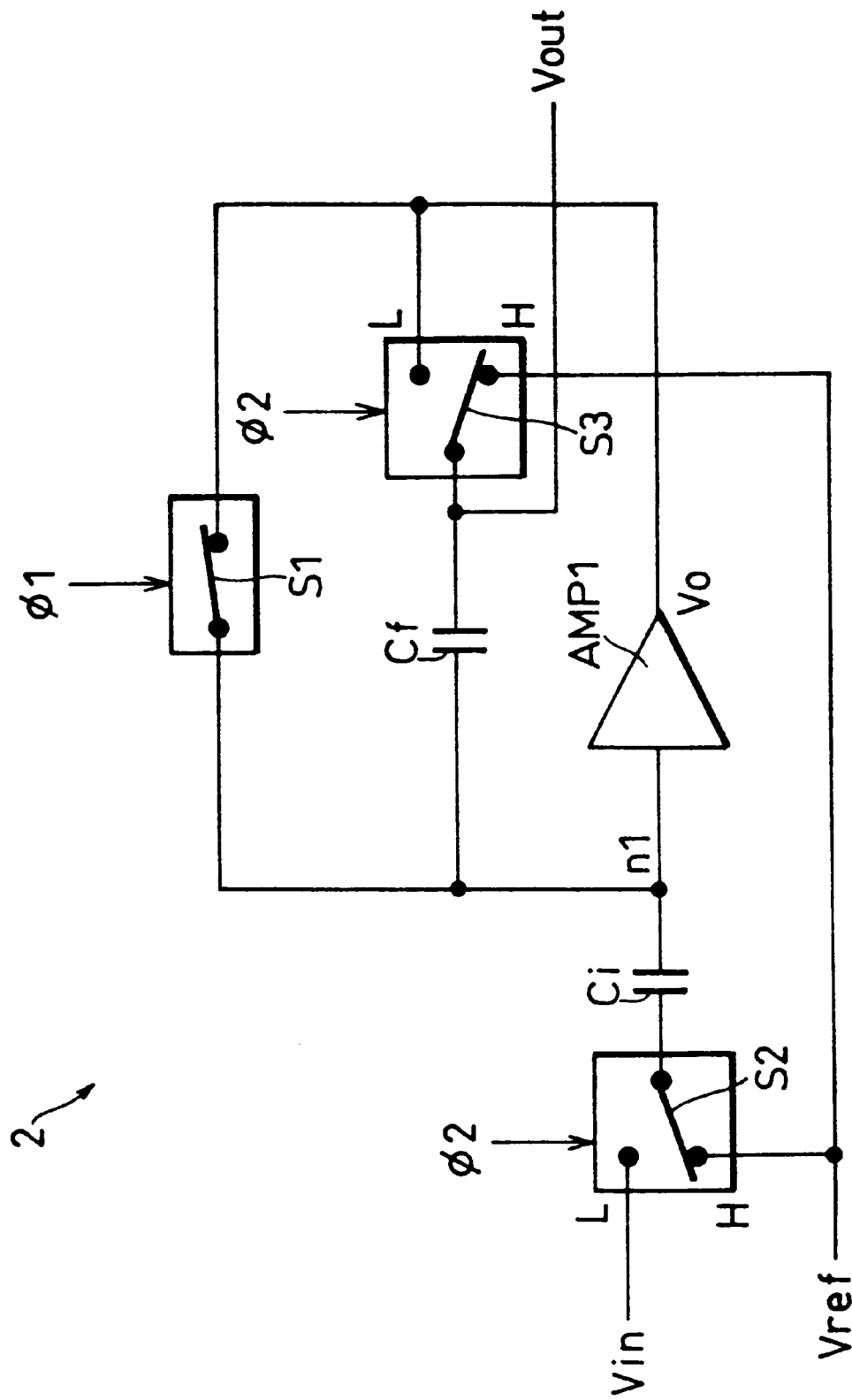
FIG. 16 is an electric circuit diagram of a typical conventional analog signal processing circuit.
Figure 18:
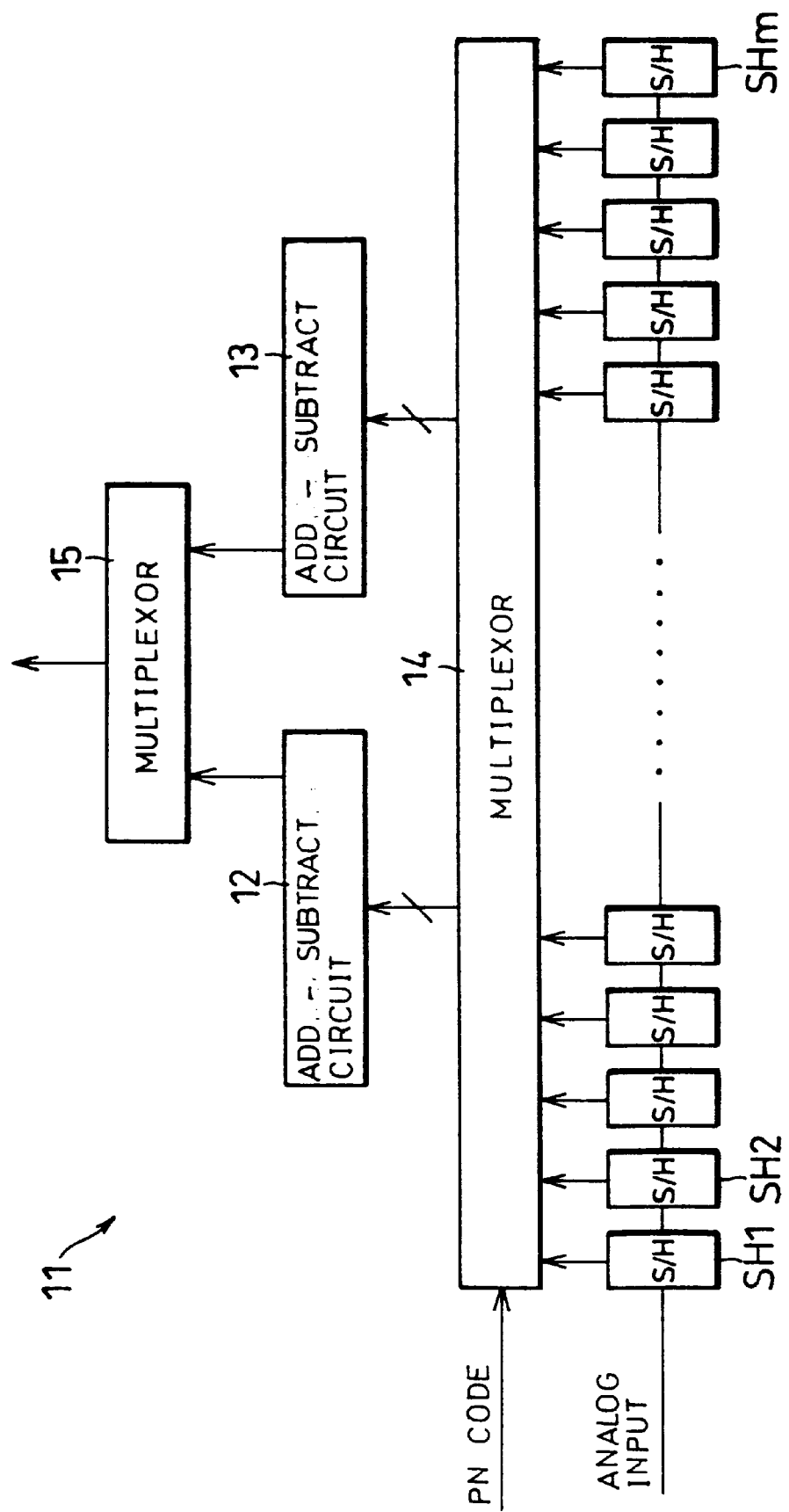
FIG. 18 is a block diagram illustrating an electric arrangement of a matched filter incorporating analog signal processing circuits shown in FIG. 16.
Figure 19:
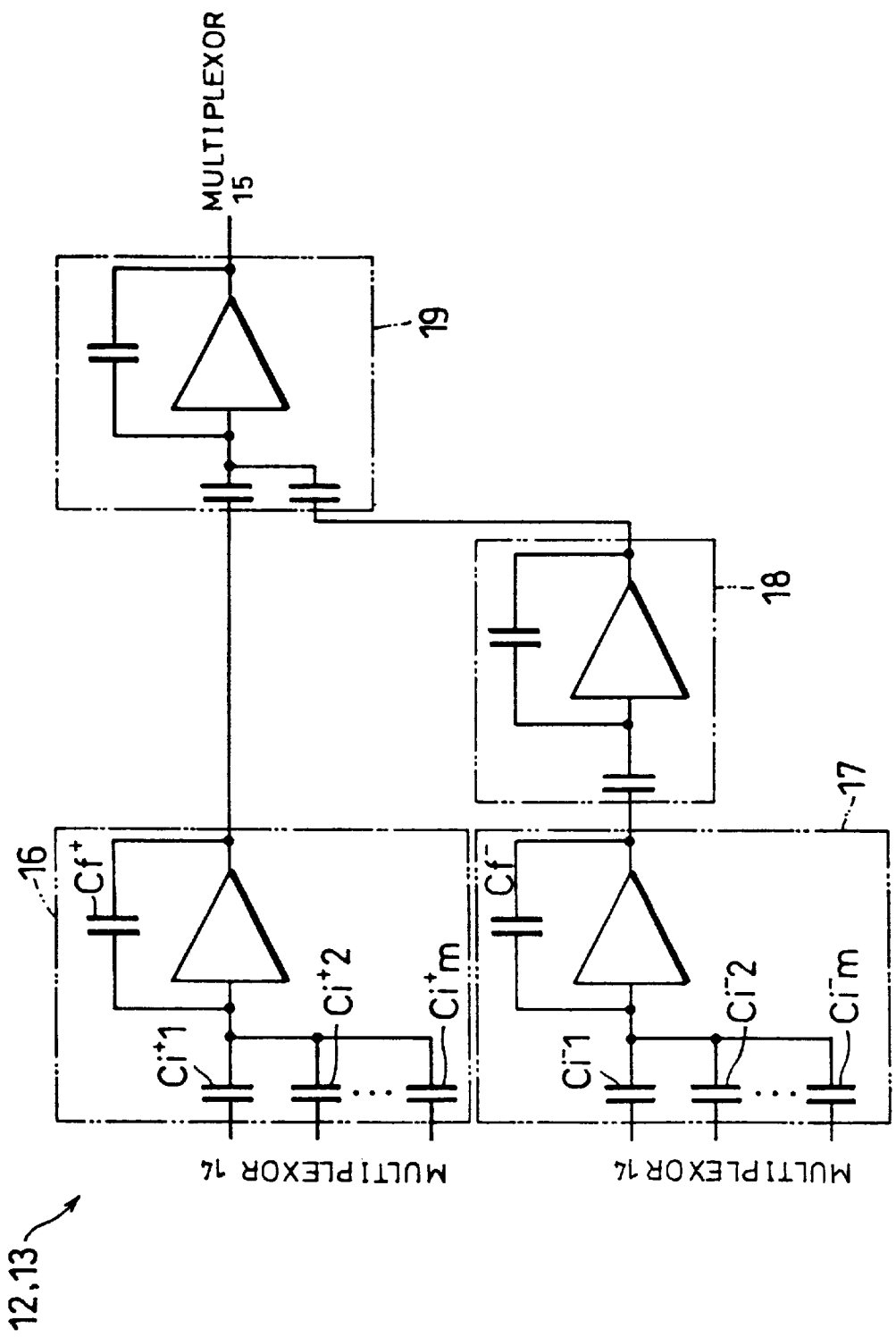
FIG. 19 is a block diagram illustrating a concrete example of an arrangement of an add-subtract circuit in the matched filter, in the case where analog signal processing circuits are used in the add-subtract circuit.

The following description will explain a fourth embodiment of the present invention, while referring to FIG. 14.

FIG. 14 is an electric circuit diagram of an analog signal processing circuit 61 in accordance with the fourth embodiment of the present invention. In the analog signal processing circuit 61, the members having the same structure (function) as those in the analog signal processing circuit 51 will be designated by the same reference numerals and their description will be omitted.

What is noticeable is that in an amplifier AMP2 of the analog signal processing circuit 61, there are provided a feedback capacitor Cc as a feedback circuit for determining a gain. There is also provided a switch SW3 which is closed in response to a control signal Φ2 so as to refresh the feedback capacitor Cc by removing charges accumulated therein. Moreover, there are provided an amplifier AMP3 for inverting an output of the amplifier AMP2, an input capacitor Cd and a feedback capacitor Ce for determining a gain of the amplifier AMP3, and switches SW4 and SW5 for refreshing the feedback capacitor Ce.

While the control signals Φ1 and Φ2 are at a high level, an refreshing operation for compensating input off-set voltages of the amplifiers AMP2 and AMP3 is carried out. On the other hand, while the control signals Φ1 and Φ2 are at a low level, the adaptive control operation is carried out.

In the analog signal processing circuit 61, in a state where the input off-set voltages of the amplifiers AMP2 and AMP3 are compensated, voltage transfer characteristics from a node n2 to a node n3 are expressed as:

$$Vn3-Vref=(Cd/Ce)\cdot(Cb/Cc)\cdot(Vn2-Vref) \qquad (18)$$

Therefore, by setting capacitances Cb, Cc, Cd, and Ce to appropriate values, a gain of the adaptive control system, that is, a gain G2, can be set to a desired value, for example, 1 to several hundred. In the analog signal processing circuit 51, a gain of the amplifier AMP2 becomes as high as around 60 dB, thereby making it impossible to satisfy the formula (16) in the case where the target signal and the background signal fall in some specific frequency bands, respectively. On the other hand, such inconvenience does not take place in the case of the analog signal processing circuit 61.

To be more specific, in the case where the amplifier AMP2 is used without feedback, the gain of the adaptive control signal becomes greater. As a result, in the case where the target signal and the background signal fall in some specific frequency bands, respectively, sometimes the stabilizing condition for suppressing oscillation are not satisfied. On the other hand, by providing the feedback capacitor Cc for determining the gain of the amplifier AMP2, the gain for the adaptive control signal is controlled and the oscillation is surely prevented.

Since the amplifier AMP3 is only required to have a function of inverting a polarity of the output of the amplifier AMP2, a differential amplifier wherein feedback is carried out through a resistance may be used as the amplifier AMP3. Besides, the amplifier AMP1 is not necessarily an inverting amplifier, and another amplifier may be used, such as a differential amplifier to which the reference voltage Vref is supplied through a non-inverting input terminal thereof.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An analog signal processing device of a capacitive coupling type, comprising:

an amplifier;

an input capacitor, provided on a side of an input end of said amplifier;

a feedback capacitor, provided between the input end and an output end of said amplifier; and an adaptive control circuit for adjusting a DC level of an output signal of said amplifier to an operating point voltage of said amplifier, by negatively feeding back, to the input end of said amplifier, only a low frequency component of a difference between the output signal and the operating point voltage, the low frequency component sharing no frequency band with a target signal to be processed, the target signal being included in an input signal supplied to said amplifier, the analog signal processing device multiplying the target signal by −(Ci/Cf), where Ci and Cf represent a capacitance of said input capacitor and a capacitance of said feedback capacitor, respectively.

2. The analog signal processing device as set forth in claim 1, wherein said adaptive control circuit has a high resistance such that a product of the high resistance and the capacitance of said feedback capacitor is not less than $10^{-4}$ seconds.

3. The analog signal processing device as set forth in claim 1, further comprising a low-pass filter for extracting a low frequency component out of an output signal of said analog signal processing device, an output of said low-pass filter and the output of said analog signal processing device being used as differential signals.

4. An analog signal processing device of a capacitive coupling type, comprising:

an amplifier;

an input capacitor, provided on a side of an input end of said amplifier;

a feedback capacitor, provided between the input end and an output end of said amplifier;

an adaptive control circuit for adjusting a DC level of an output signal of said amplifier to a predetermined reference level, by negatively feeding back, to the input end of said amplifier, only a low frequency component of a difference between the output signal and the predetermined reference level, the low frequency component sharing no frequency band with a target signal to be processed, the target signal being included in an input signal supplied to said amplifier, said adaptive control having a comparator for generating a voltage corresponding to the difference between the output signal and the predetermined reference level, and a feedback resistor for negatively feeding back an output of said comparator to the input end of said amplifier, a gain of said comparator and a resistance of said feedback resistor being set so that a phase lag of an adaptive control signal of said adaptive control circuit with respect to the input signal supplied to said amplifier is less than 180° at a frequency which makes a gain of the analog signal processing device a unity gain;

first switching means, connected to a first input of said comparator through which the output signal of said amplifier is supplied to said comparator, for selectively supplying either the output signal of said amplifier or a voltage corresponding to the predetermined reference level;

an input coupling capacitor, connected to a second input of said comparator, through which the voltage corresponding to the predetermined reference level is supplied to said comparator; and second switching means for connecting and disconnecting an output end of said comparator and the second input of said comparator.

5. The analog signal processing device as set forth in claim 4, further comprising a feedback circuit for determining a gain of said comparator.

6. The analog signal processing device as set forth in claim 5, wherein said feedback circuit is a second feedback capacitor.

7. The analog signal processing device as set forth in claim 6, further comprising third switching means for removing charges accumulated in said second feedback capacitor.

8. The analog signal processing device as set forth in claim 7, further comprising:

an inverting amplifier for inverting an output of said comparator;

a gain determining capacitor for determining a gain of said inverting amplifier;

a third feedback capacitor being provided as a feedback circuit of said inverting amplifier; and fourth switching means for refreshing said third feedback capacitor.

9. The analog signal processing device as set forth in claim 4, serving as a multiplier for multiplying the target signal by $-(Ci/Cf)$, where Ci and Cf represent a capacitance of said input capacitor and a capacitance of said feedback capacitor, respectively.

10. The analog signal processing device as set forth in claim 4, further comprising a low-pass filter for extracting a low frequency component out of an output of said analog signal processing device, an output of said low-pass filter and the output of said analog signal processing device being used as differential signals.

11. A correlation computing device comprising an analog signal processing device of a capacitive coupling type, said analog signal processing device having an amplifier, a plurality of input capacitors provided on a side of an input end of said amplifier, a feedback capacitor provided between the input end and an output end of said amplifier, and an adaptive control circuit for adjusting a DC level of an output signal of said amplifier to an operating point voltage of said amplifier by negatively feeding back, to the input end of said amplifier, only a low frequency component of a difference between the output signal of said amplifier and the operating point voltage of said amplifier, the low frequency component sharing no frequency band with a target signal to be processed, the target signal being included in an input signal supplied to said amplifier, said input capacitors being provided in parallel so as to respectively correspond to a plurality of input signals supplied to said amplifier, each of said input capacitors having a capacitance corresponding to a predetermined coefficient that is predetermined so that a product adding operation is carried out with respect to the plurality of input signals by multiplying each of the plurality of input signals by a corresponding predetermined coefficient and adding the multiplied results to each other.

12. The correlation computing device as set forth in claim 11, wherein said adaptive control circuit has a high resistance such that a product of the high resistance and a capacitance of said feedback capacitor is not less than $10^{-4}$ seconds.

13. The correlation computing device as set forth in claim 11, wherein said analog signal processing device serves as a multiplier for multiplying each of target signals included in the plurality of input signals by $-(Ci/Cf)$, where Ci and Cf represent corresponding capacitances of said input capacitors and a capacitance of said feedback capacitor, respectively.

14. The correlation computing device as set forth in claim 11, wherein said analog signal processing device further includes a low-pass filter for extracting a low frequency component out of an output of said analog signal processing device, an output of said low-pass filter and the output of said analog signal processing device being used as differential signals.

15. A correlation computing device comprising an analog signal processing device of a capacitive coupling type, said analog signal processing device having an amplifier, a plurality of input capacitors provided on a side of an input end of said amplifier, a feedback capacitor provided between the input end and an output end of said amplifier, and an adaptive control circuit for adjusting a DC level of an output signal of said amplifier to a predetermined reference level by negatively feeding back, to the input end of said amplifier, only a low frequency component of a difference between the output signal of said amplifier and the predetermined reference level, the low frequency component sharing no frequency band with a target signal to be processed, the target signal being included in an input signal supplied to said amplifier, said input capacitors being provided in parallel so as to respectively correspond to a plurality of input signals supplied to said amplifier, each of said input capacitors having a capacitance corresponding to a predetermined coefficient, so that a, product adding operation is carried out with respect to the plurality of input signals by multiplying each of the plurality of input signals by a corresponding predetermined coefficient and adding the multiplied results to each other.

16. The correlation computing device as set forth in claim 15, wherein said adaptive control circuit has a comparator for generating a voltage corresponding to the difference between the output signal and the predetermined reference level, and a feedback resistor for negatively feeding back an output of said comparator to the input end of said amplifier, a gain of said comparator and resistance of said feedback resistor being set so that a phase lag of an adaptive control signal of said adaptive control circuit with respect to each of the plurality of input signals supplied to said amplifier is less than 180° at a frequency which makes a gain of said analog signal processing device a unity gain.

17. The correlation computing device as set forth in claim 16, wherein said analog signal processing device further includes:

first switching means, connected to a first input of said comparator through which the output signal is supplied to said comparator, for selectively supplying either the output signal or a voltage corresponding to the predetermined reference level;

an input coupling capacitors connected to a second input said comparator, through which the voltage corresponding to the predetermined reference level is supplied to said comparator; and second switching means for connecting and disconnecting an output end of said comparator and the second input of said comparator.

18. The correlation computing device as set forth in claim 17, wherein said analog signal processing device further includes a feedback circuit for determining a gain of said comparator.

19. The correlation computing device as set forth in claim 18, wherein said feedback circuit is a second feedback capacitor.

20. The correlation computing device as set forth in claim 19, wherein said analog signal computing device further includes third switching means for removing charges accumulated in said second feedback capacitor.

21. The correlation computing device as set forth in claim 20, wherein said analog signal computing device further includes:

an inverting amplifier for inverting an output of said comparator;

a gain determining capacitor for determining a gain of said inverting amplifier;

a third feedback capacitor being provided as a feedback circuit of said inverting amplifier; and fourth switching means for refreshing said third feedback capacitor.

22. The correlation computing device as set forth in claim 15, wherein said analog signal processing device serves as a multiplier for multiplying each of target signal components included in the plurality of input signals by $-(Ci/Cf)$, where Ci and Cf represent corresponding capacitances of said input capacitors and a capacitance of said first feedback capacitor, respectively.

23. The correlation computing device as set forth in claim 15, wherein said analog signal processing device further includes a low-pas filter for extracting a low frequency component out of an output of said analog signal processing device, an output of said low-pass filter and the output of said analog signal processing device being used as differential signals.

* * * * *